United States Patent
Barree et al.

(10) Patent No.: US 12,292,212 B2
(45) Date of Patent: May 6, 2025

(54) OPTIMIZING WELL PLACEMENT TO MAXIMIZE EXPOSED HYDRAULIC FRACTURE AREA IN GEOTHERMAL WELLS

(71) Applicant: Halliburton Energy Services, Inc., Houston, TX (US)

(72) Inventors: Robert Barree, Lakewood, CO (US); Ronald Glen Dusterhoft, Houston, TX (US); Neil Alan Stegent, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 25 days.

(21) Appl. No.: 18/210,211

(22) Filed: Jun. 15, 2023

(65) Prior Publication Data
US 2024/0418412 A1    Dec. 19, 2024

(51) Int. Cl.
*F24T 10/20* (2018.01)
*E21B 7/04* (2006.01)
(Continued)

(52) U.S. Cl.
CPC ............ *F24T 10/20* (2018.05); *E21B 7/04* (2013.01); *E21B 33/03* (2013.01); *F03G 4/06* (2021.08);
(Continued)

(58) Field of Classification Search
CPC ...... G06F 30/00; G06F 30/28; E21B 2200/20; E21B 7/04; E21B 33/03; E21B 43/26;
(Continued)

(56) References Cited

U.S. PATENT DOCUMENTS 6,732,796 B2    5/2004   Vinegar et al.
7,217,304 B2    5/2007   Deckman et al.
(Continued)

FOREIGN PATENT DOCUMENTS

GB        2628423 A      9/2024
WO    2011010113 A2      1/2011
(Continued)

OTHER PUBLICATIONS

Xin, Shouliang et al., "Electrical Power Generation from Low Temperature Co-Produced Geothermal Resources at Huabei Oilfield", Jan. 30-Feb. 1, 2012, Proceedings Thirty-Seventh Workshop on Geothermal Reservoir Engineering, Stanford University. (Year: 2012).*

(Continued)

*Primary Examiner* — Cedric Johnson
(74) *Attorney, Agent, or Firm* — Conley Rose, P.C.; Rodney B. Carroll

(57) ABSTRACT

A method of constructing an injection well for a geothermal energy system comprising determining a fracture area of an injection well with a curved wellbore by inputting the curved wellbore path, a set of formation properties, and a fracturing operation, into a fracturing model. The curved wellbore path can promote fracture interference between fracture stresses extending from the injection wellbore. A production model can determine an economic value of the production fluids produced from at least one production well by determining a contact time for the injection fluids to traverse the formation. A design process can iterate the curved wellbore path of the injection well to produce a production fluid with an economic value above a threshold value.

27 Claims, 14 Drawing Sheets

(51) Int. Cl.
*E21B 33/03* (2006.01)
*F03G 4/06* (2006.01)
*F24T 50/00* (2018.01)
*G06F 30/28* (2020.01)
*E21B 43/26* (2006.01)
*E21B 49/00* (2006.01)

(52) U.S. Cl.
CPC .............. *F24T 50/00* (2018.05); *G06F 30/28* (2020.01); *E21B 43/26* (2013.01); *E21B 49/00* (2013.01); *F24T 2201/00* (2018.05)

(58) Field of Classification Search
CPC . E21B 49/00; F24T 10/20; F24T 50/00; F24T 2201/00; F03G 4/06
USPC ........................................................ 703/10, 6
See application file for complete search history.

(56) References Cited

U.S. PATENT DOCUMENTS

| | | | |
|---|---|---|---|
| 7,331,179 | B2 | 2/2008 | Balan et al. |
| 7,448,214 | B2 | 11/2008 | Monostory et al. |
| 7,891,188 | B2 | 2/2011 | Zachar |
| 8,240,370 | B2 | 8/2012 | Palamara et al. |
| 8,414,666 | B2 | 4/2013 | Palamara et al. |
| 8,430,166 | B2 | 4/2013 | Danko |
| 8,479,834 | B2 | 7/2013 | Preston |
| 9,261,097 | B2 | 2/2016 | Moricca et al. |
| 9,309,749 | B2 | 4/2016 | Kaminsky |
| 10,429,533 | B2 | 10/2019 | Noui-Mehidi et al. |
| 10,920,152 | B2 | 2/2021 | Snow et al. |
| 10,927,604 | B2 | 2/2021 | Danko |
| 10,982,517 | B2 | 4/2021 | Al-Mulhern et al. |
| 11,155,462 | B2 | 10/2021 | Arkadakskiy et al. |
| 11,530,603 | B2 | 12/2022 | Gates et al. |
| 2005/0239661 | A1 | 10/2005 | Pfefferle |
| 2006/0011472 | A1 | 1/2006 | Flick |
| 2010/0288466 | A1 | 11/2010 | Danko |
| 2010/0307756 | A1 | 12/2010 | Jung et al. |
| 2010/0314105 | A1* | 12/2010 | Rose ................... E21B 49/008 166/250.1 |
| 2012/0199354 | A1 | 8/2012 | Kaminsky |
| 2020/0011151 | A1 | 1/2020 | Toews et al. |
| 2020/0182019 | A1 | 6/2020 | Wang et al. |
| 2022/0034209 | A1 | 2/2022 | Hytken |
| 2022/0034258 | A1 | 2/2022 | Aikman |
| 2022/0339609 | A1 | 10/2022 | Hu et al. |
| 2023/0119784 | A1 | 4/2023 | Reinertsen et al. |

FOREIGN PATENT DOCUMENTS

| | | |
|---|---|---|
| WO | 2014039052 A1 | 3/2014 |
| WO | 2019199433 A1 | 10/2019 |
| WO | 2019224326 A1 | 11/2019 |
| WO | 2021237137 A1 | 11/2021 |

OTHER PUBLICATIONS

Negre, Andres et al., "Estimation of Geothermal Electric Power Production from Mature Oil Fields", ADIPEC, Oct. 31-Nov. 3, 2022, Society of Petroleum Engineers. (Year: 2022).*
ElectronicAcknowledgement Receipt, Specification and Drawings for U.S. Appl. No. 18/385,125, filed Dec. 20, 2023, entitled "Manufacturing Hydrogen and Storing Same in Horizontallydrilled Wells,", 70 pages.
R.D. Barree., "Stress Shadowing and Fracture Interference in GOHFER," White Paper, Halliburton Production Enhancement. May 30, 2015. 10 pages.
Filing Receipt and Drawings for U.S. Appl. No. 18/390,719, filed Dec. 20, 2023, titled "Methods of Generating Hydrogen in High-Temperature, Tight Subterranean Formations." 59 pages.
Karma Zuraiqi, Liquid Metals in Catalysis for Energy Applications, Joule Review, Nov. 18, 2020. pp. 2290-2321, Cell Press.
Hydrogen Storage, Wikipedia. Nov. 30, 2023. 34 pages.
Office of Energy & Renewable Energy, Hydrogen and Fuel Cell Technologies Office. Hydrogen Storage, Nov. 30, 2023. 8 pages.
Loyd East Jr., "Methods for Enhancing Far-Field Complexity in Fracturing Operations," SPE Annual Technical Conference and Exhibition, Florence, Italy. Sep. 2010. pp. 291-303.

* cited by examiner

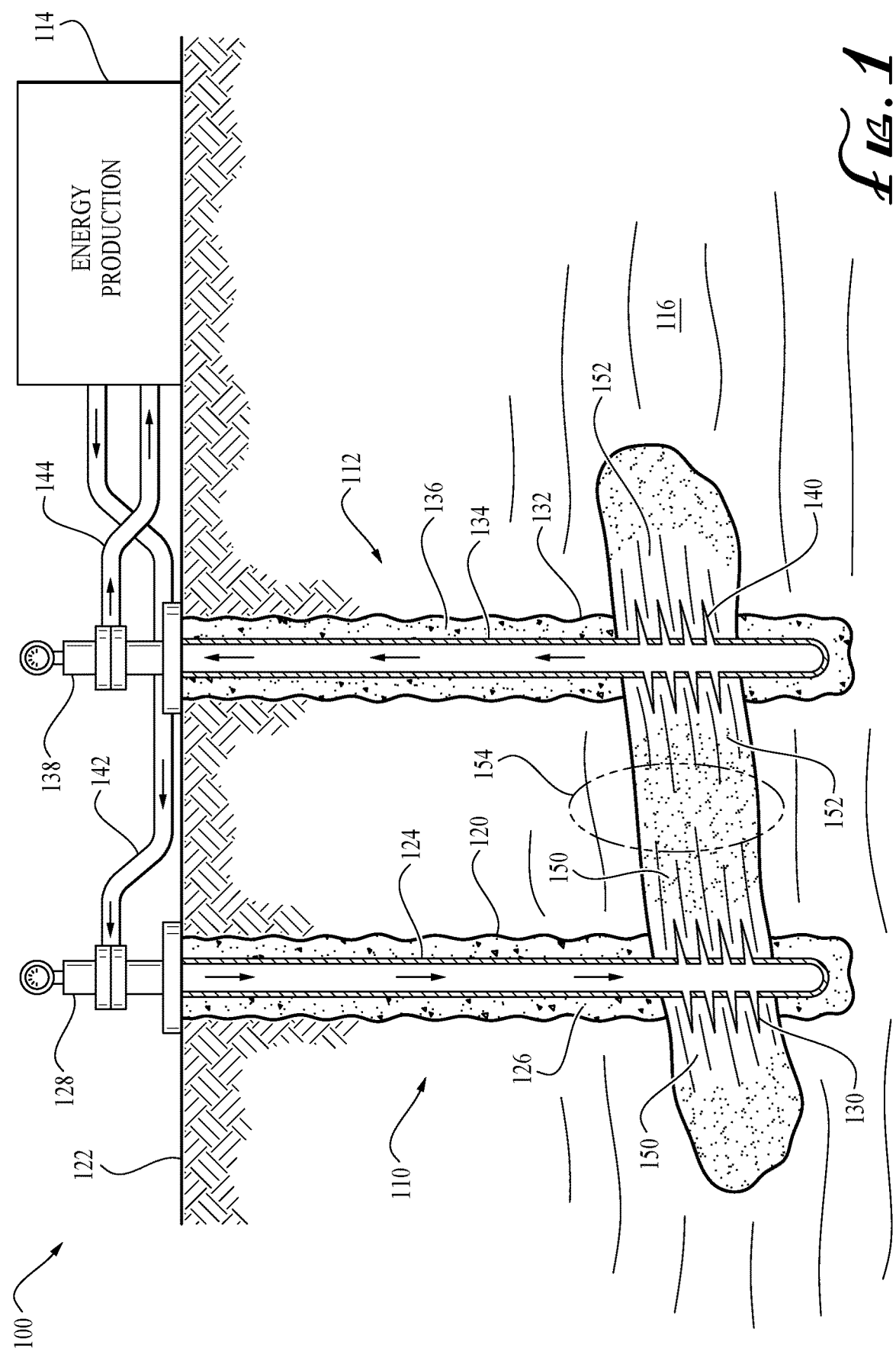

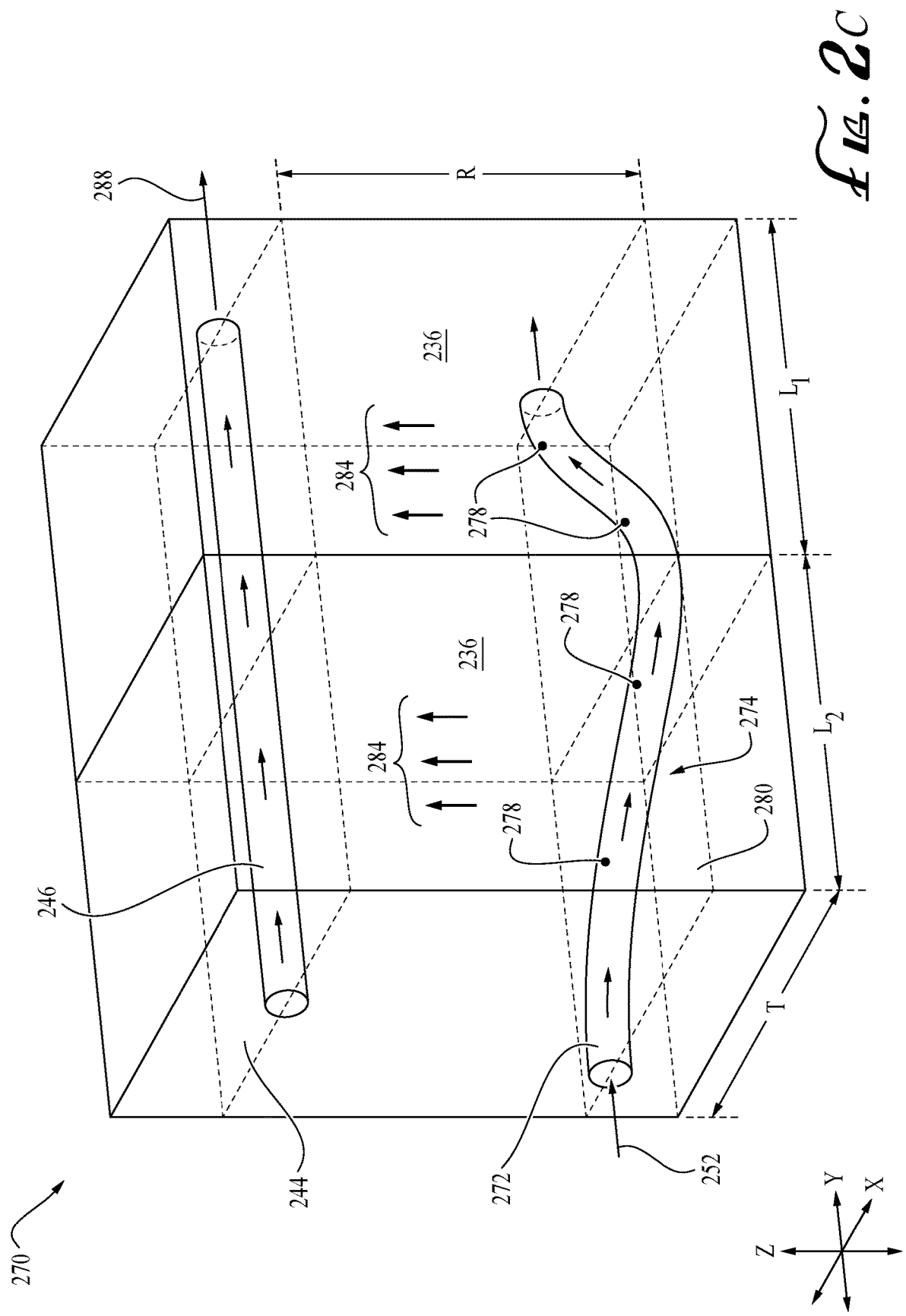

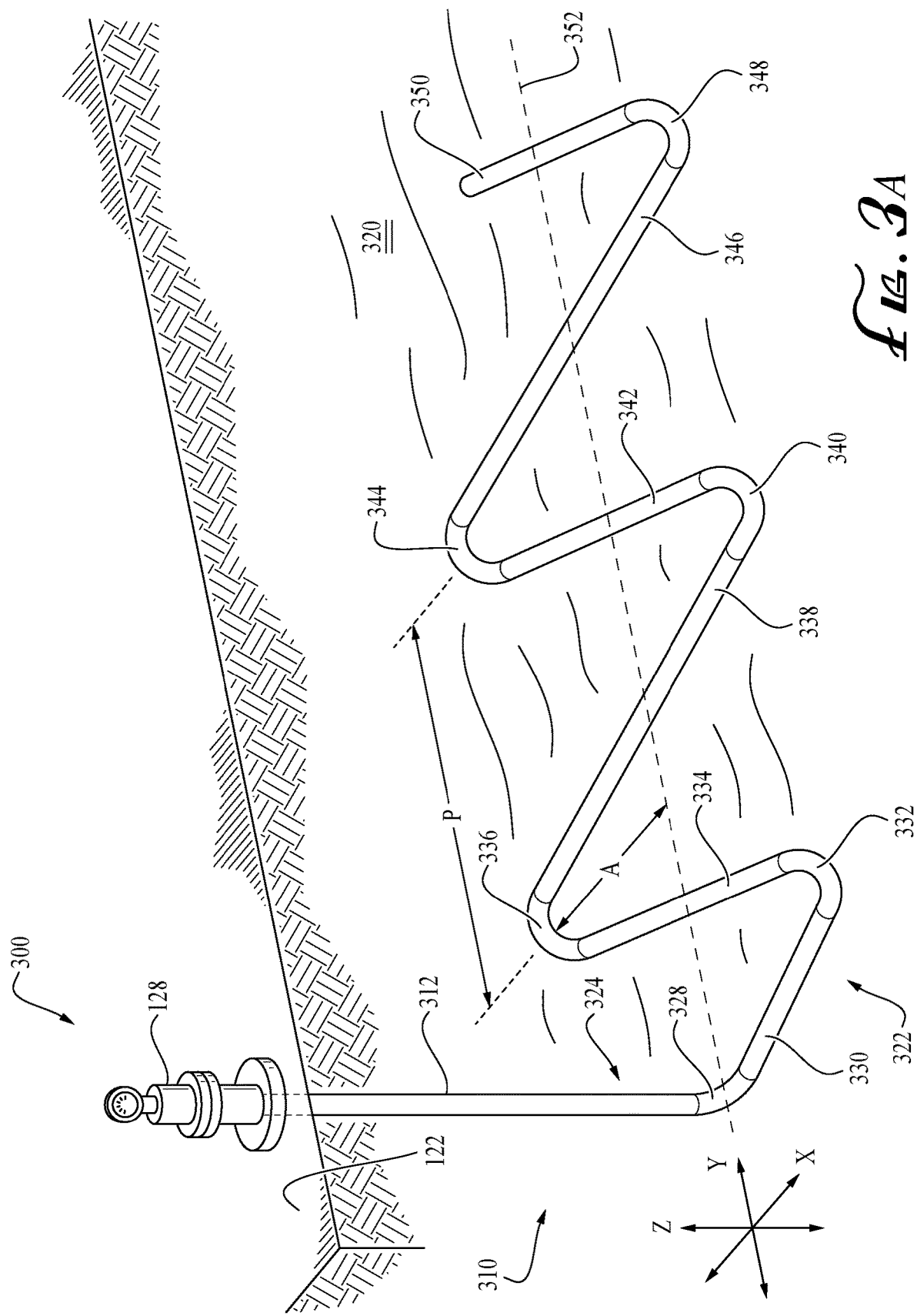

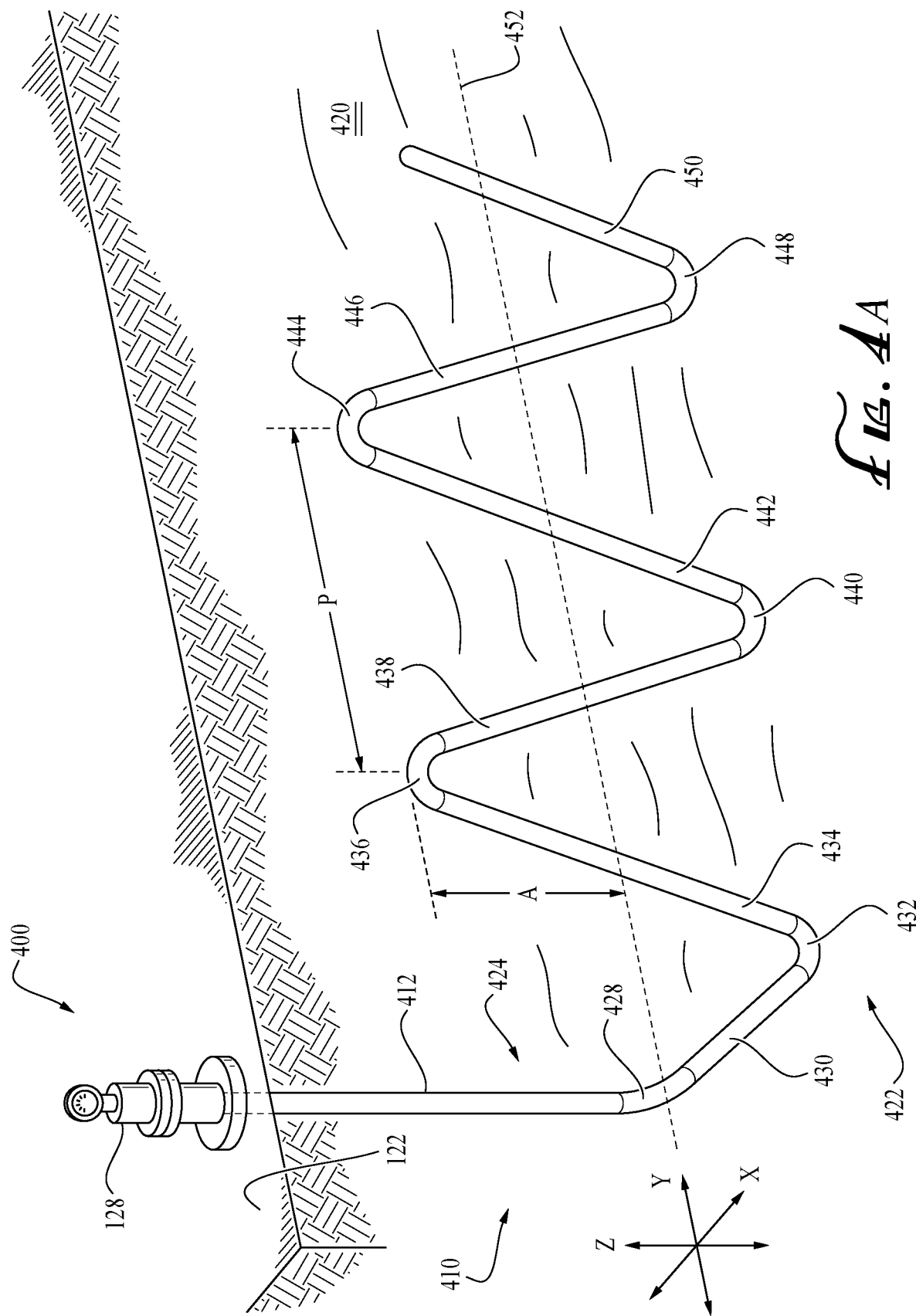

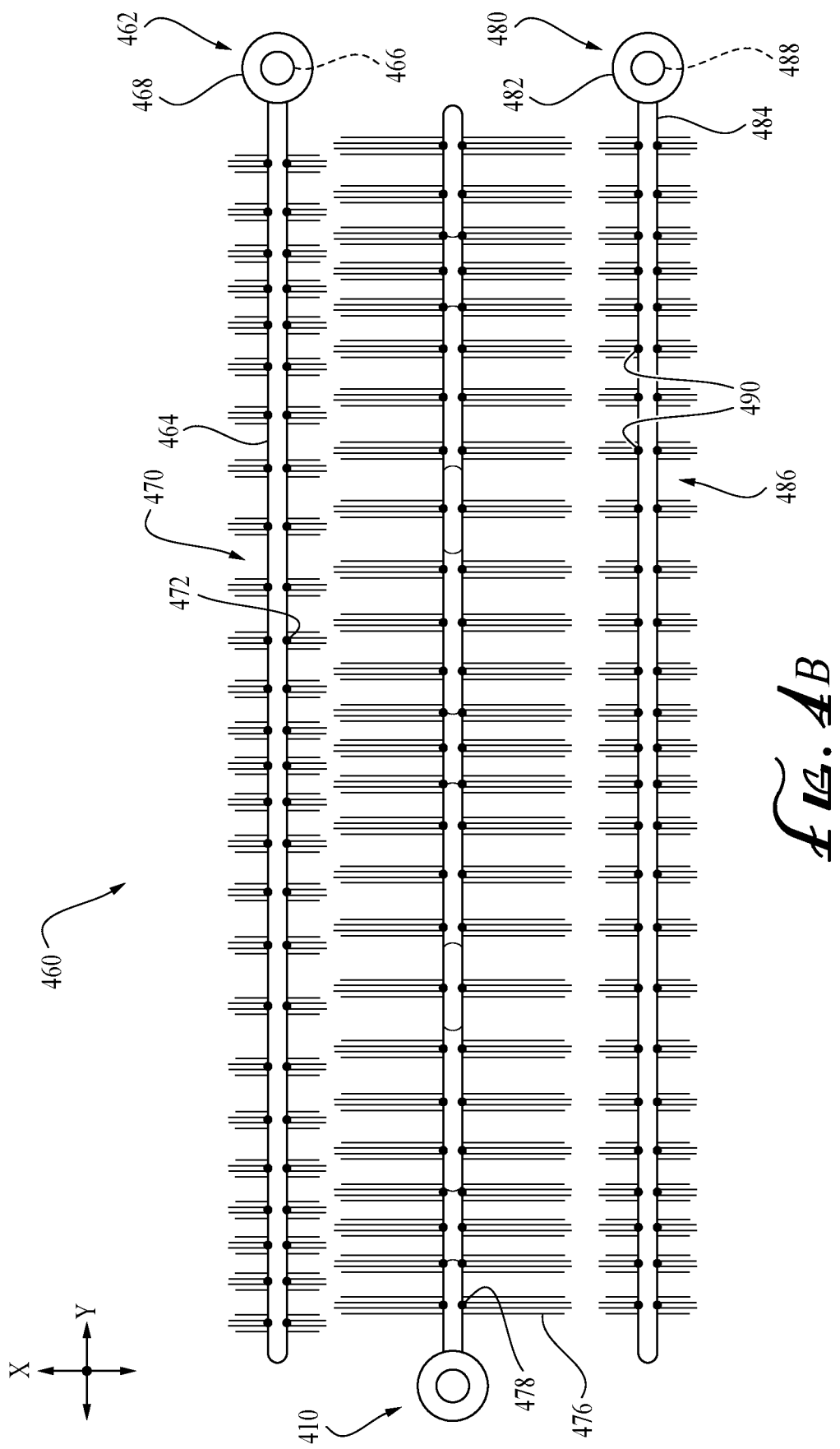

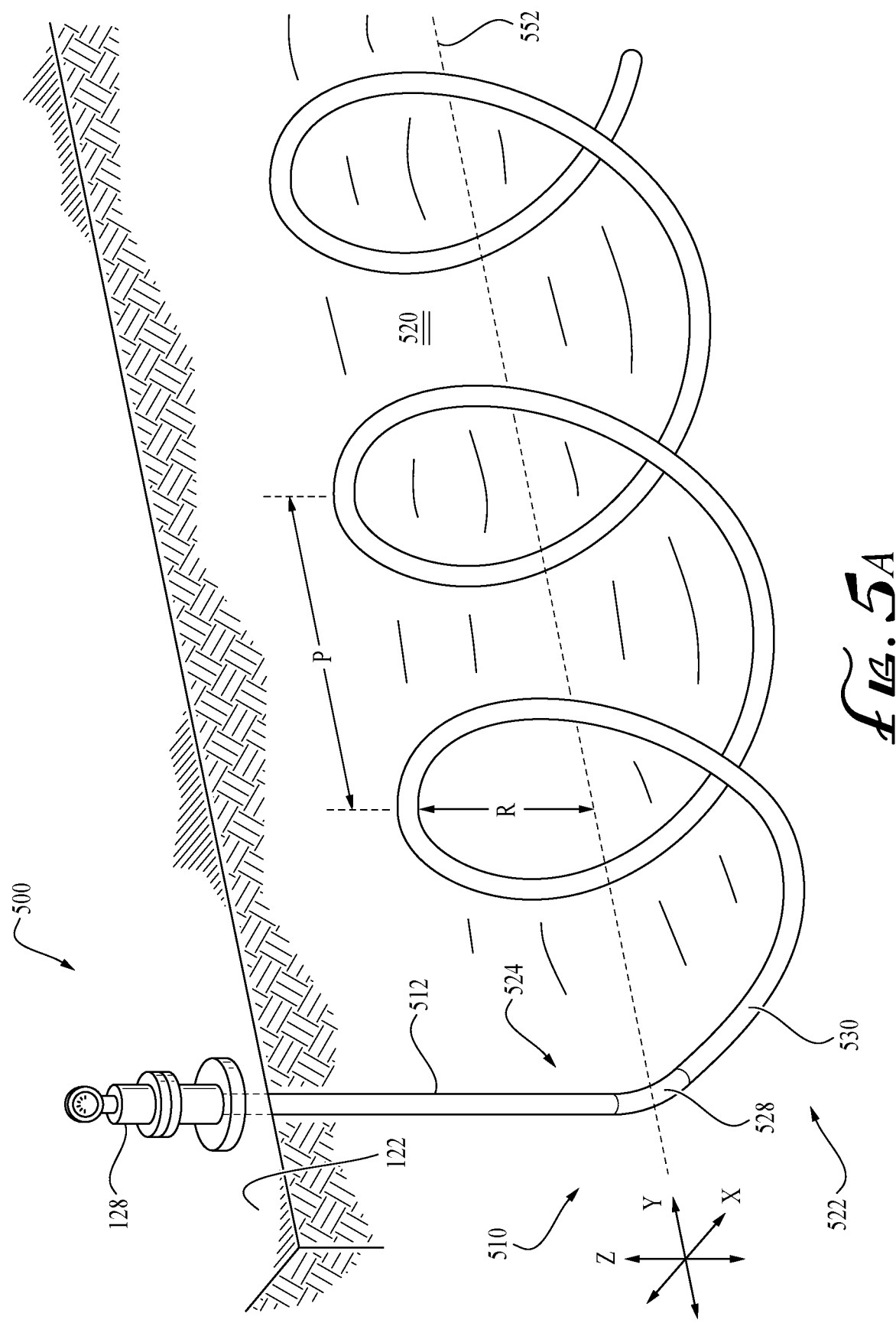

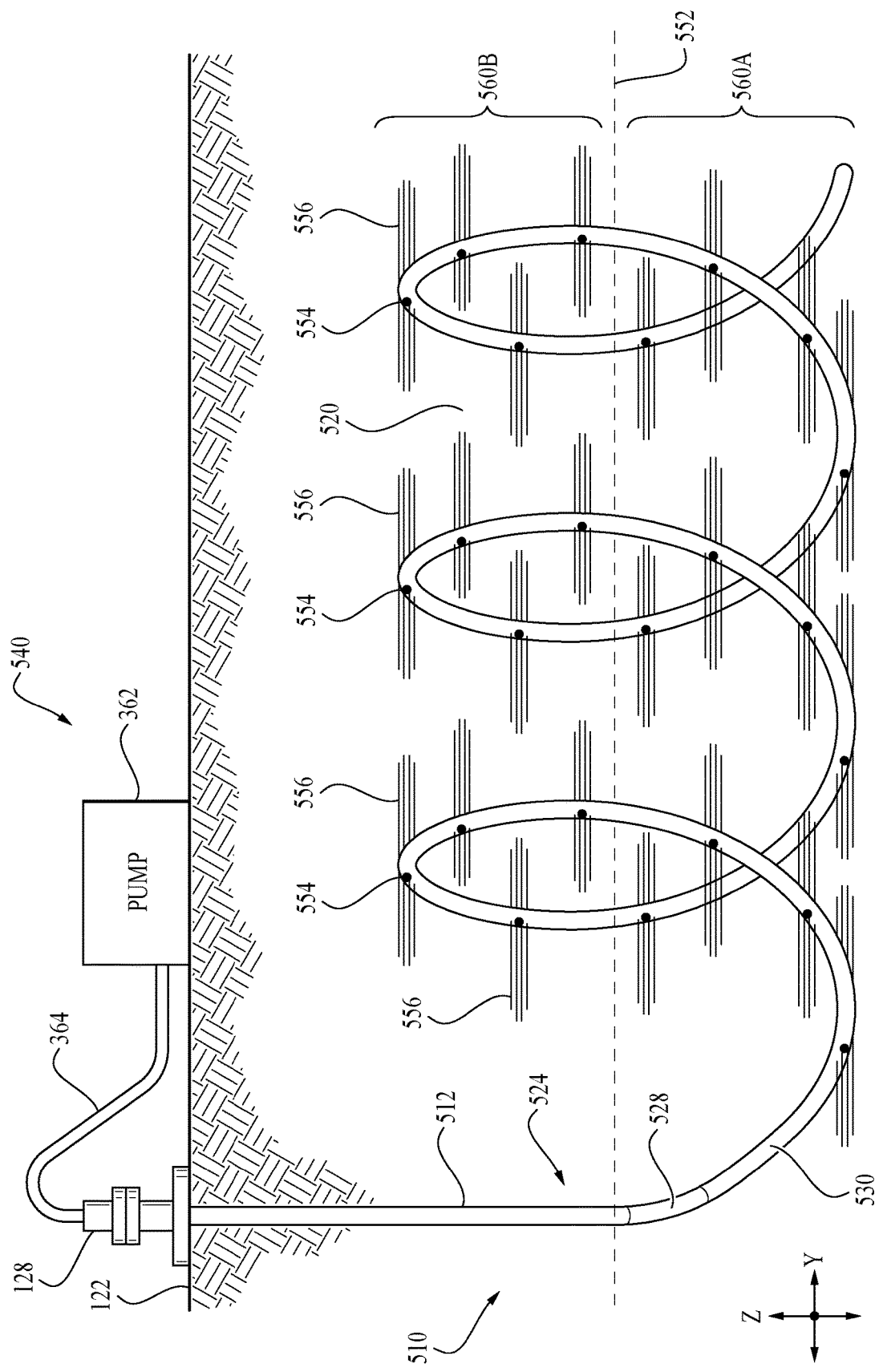

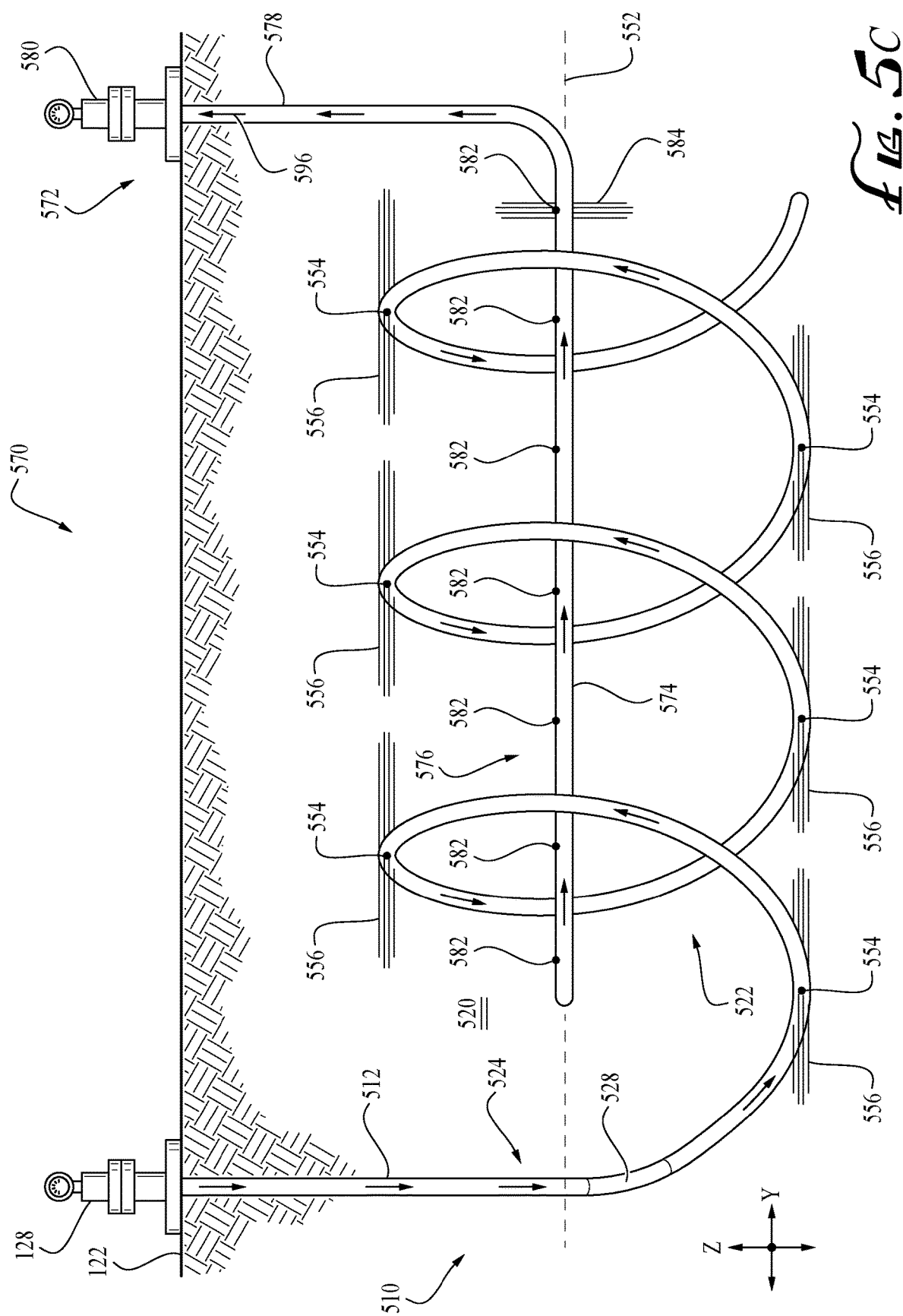

OPTIMIZING WELL PLACEMENT TO MAXIMIZE EXPOSED HYDRAULIC FRACTURE AREA IN GEOTHERMAL WELLS

BACKGROUND

Geothermal power is electrical power generated from geothermal energy. Geothermal power stations utilize water heated from a subterranean formation to generate steam, or heat another working fluid, to turn a turbine of a generator and thereby produce electricity. Steam generation can be a product of a number of different methods that includes the injection of water into subterranean formation and the production of heated water from the same subterranean formation.

Geothermal power may be economically feasible in a small number of available locations due a limited efficiency of the production of heated water. The efficiency of the production of heated water and/or steam can depend on the heat exchange process between the injected water and the subterranean formation. The heat exchange process can be a function of exposed surface area, reservoir geomechanical properties, and fracture conductivity. A method of improving the heat exchange process to increase the efficiency of the production of heated water is desirable.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

FIG. 1 is a partial cross-sectional view of a geothermal energy production system according to an embodiment of the disclosure.

FIG. 2C is a perspective view of an improved geothermal system according to an embodiment of the disclosure.

FIG. 3A is a perspective view of an injection well drilled with a horizontal sinusoidal wellbore path according to another embodiment of the disclosure.

FIG. 4A is a perspective view of an injection wellbore with a vertical sinusoidal wellbore path according to still another embodiment of the disclosure.

FIG. 4B is a top view of the vertical sinusoidal wellbore with hydraulically induced fractures and one or more production wells according to still another embodiment of the disclosure.

FIG. 5A is a perspective view of a deviated well drilled along the y-axis with a helical wellbore path according to yet another embodiment of the disclosure.

FIG. 5B is a perspective view of the helical wellbore with hydraulically induced fractures extending outward in the horizontal plane according to yet another embodiment of the disclosure.

FIG. 5C is a perspective view of the helical wellbore with hydraulically induced fractures and at least one production well according to yet another embodiment of the disclosure.

DETAILED DESCRIPTION

Figure 2A:
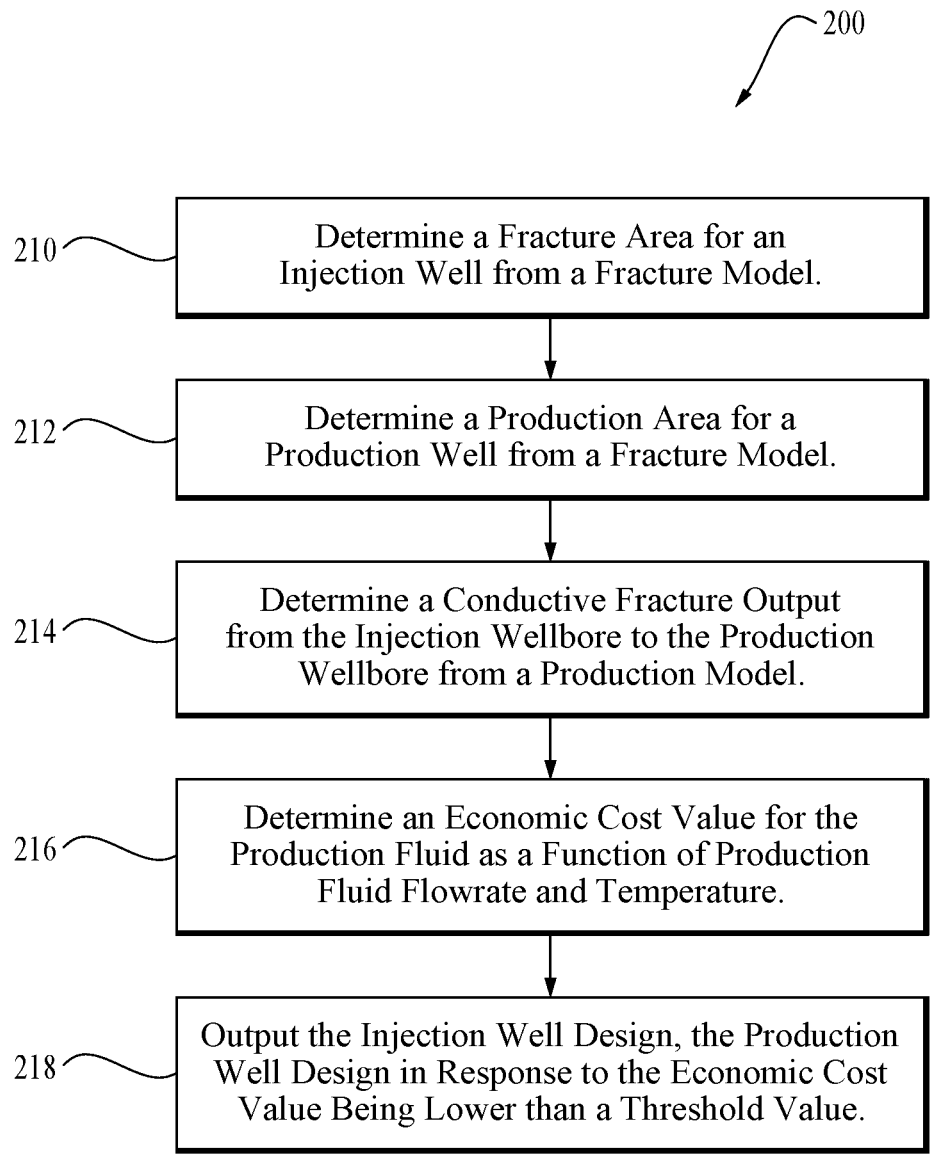
FIG. 2A is a logical block diagram of a method suitable for implementing one or more embodiments of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

Certain embodiments according to the present disclosure may be directed to systems and methods for increasing and/or improving the heat process within geothermal wells. Currently, a number of installations around the world use natural hydrothermal formations to produce natural hot water or steam from subsurface formations to run turbines or to heat a working fluid to run the turbines. Other installations use hot dry formations, also called "hot dry rock" formations, that require an enhanced wellbore operation to fracture the formation to provide pathways for fluid injection and production. The harvesting of heat from these geothermal wells generally utilize an injection well to provide a fluid source and a production well to extract the heated water and/or steam to the power facility at surface.

The geothermal power system may utilize one injection well or a plurality of injection wells to supply fluid from the surface to the hot dry formation. One or more production wells can produce the heated water or steam back to the surface. An exemplary geothermal power system 100 is illustrated in a partial cross-sectional view of FIG. 1. The geothermal power system 100 can comprise an injection well 110, a production well 112, and a geothermal power station 114. The injection well 110 can comprise a wellbore 120 extending from surface 122 to a hot rock formation 116. The wellbore 120 can be drilled with any suitable drilling system, for example, a drilling rig, a drill string with a drill bit, and a drilling fluid system. A string of casing 124 can extend from an injection wellhead 128 at surface 122 to the target depth within the hot rock formation 116. Cement 126 can be placed between the string of casing 124 and the wellbore 120 to form an isolation barrier and anchor the string of casing 124. The casing string 124 can be perforated 130 by any suitable means, e.g., perforation gun assembly, to fluidically couple the interior of the casing string 124 with the formation 116.

The production well 112 can comprise a wellbore 132 extending from surface 122 to a hot rock formation 116. The wellbore 132 can be drilled with any suitable drilling system, for example, a drilling rig, a drill string with a drill bit, and a drilling fluid system. A casing string 134 can extend from a production wellhead 138 at surface 122 to the target depth within the hot rock formation 116. Cement 136 can be placed between the casing string 134 and the wellbore 132 to form an isolation barrier and anchor the casing string 134. The casing string 134 can be perforated 140 by any suitable means, e.g., perforation gun assembly, to fluidically couple the interior of the casing string 134 with the formation 116.

The injection well 110 and the production well 112 can be coupled to the geothermal power station 114 by a supply line 142 and a steam line 144 (also referred to as the production line). The supply line 142 can deliver an injection fluid, e.g., water or brine, from the station 114 to the injection wellhead 128. The steam line 144 can supply the station 114 with a produced fluid, e.g., steam or heated water, from the production wellhead 138. The supply line 142 can include one or more pumps suitable to provide the injection fluid at a desired flowrate and pressure to the injection wellhead 128 and wellbore 120. The steam line 144 can include one or more pumps, e.g., submersible pump, to boost or pressurize the production fluids at the desired pressure and flowrate.

The geothermal power station 114 can comprise a turbine, a generator, and a condenser. A dry steam power station can utilize steam from the steam line 144 to rotate the turbine and the generator coupled to the turbine to produce electricity. The condenser cools the steam back to a liquid that is added to a surface volume of injection fluid. The injection fluid can be cooled and returned to the formation 116 via the injection well 110.

In a scenario, the geothermal power station 114 can further comprise a separator coupled to the steam line 144. A flash steam power station can receive the production fluid, e.g., heated water, in a mostly liquid state at an elevated pressure. The separator can transform the production fluid to a steam portion and a liquid portion by reducing the pressure of the production fluid. The steam portion can then be routed to the turbine to produce electricity. The liquid portion from the separator can be routed to the surface volume of injection fluid and combined with the liquid from the condenser. The injection fluid can be cooled and returned to the formation 116 via the injection well 110.

In another scenario, the geothermal power station 114 can further comprise a heat exchanger coupled to the steam line 144. A binary power station can utilize the heat exchanger to heat a secondary fluid with a low boiling point while cooling the production fluid. The secondary fluid can be propane, butane, hexane, isopentane, cyclopentene, cyclopentane, carbon dioxide, or some mixture thereof. The heat within the heat exchanger from the production fluid can vaporize the secondary fluid into a hot pressurized working fluid to turn the turbine and produce electrical power. The secondary fluid can be cooled back to a liquid phase in a condenser and returned, e.g., pumped, to the heat exchanger. The cooled production fluid exiting the heat exchanger can be routed to the surface volume of injection liquid, cooled, and returned to the formation 116 via the injection well 110.

The injection well 110 and production well 112 can be hydraulically fractured with a mixture of proppant, e.g., ceramic particles and a fracturing fluid, e.g., water. An Enhanced Geothermal System (EGS) can utilize hydraulic fracturing to improve thermal recovery from the formation 116 by exposing more surface area of the reservoir and providing additional fluid pathways via fractures propped open with the proppant, e.g., ceramic particles. A network of fractures 150 may extend into the formation 116 from the injection well 110. Likewise, a network of fractures 152 may extend into the formation 116 from the production well 112. In some scenarios, the network of fractures 150 from the injection well 110 may intersect or connect within a stress interference zone 154 with the network of fractures 152 from the production well 112, however, the occurrence of the stress interference zone 154 is not optimized with EGS designs. A method of increasing and optimizing the stress interference zone 154 is desirable.

In some embodiments, a method to optimize the stress inference comprises altering the wellbore path to produce fracture stress interference between fractures along the wellbore. Hydraulic fractures initiate perpendicular to the least principle stress and knowing this allows fracture designs to be developed for this purpose. The thermal recovery of heated production fluid from the hot rock formation can be improved by increasing the surface area of the formation with fracture stress interference between fractures along the wellbore optimized with a fracture model. The occurrence of fracture stress interference can increase the fracture height and length created along the wellbore. In some embodiments, the wellbore path can be designed with a pattern, e.g., a curved path, in the horizontal plane, the vertical plane, or combination thereof to promote or encourage the occurrence of fracture stress interference. These designed wellbore paths or covered paths, can have more vertical reservoir height covered with a single wellbore to increase the effective reservoir volume exposed through a wellbore servicing operation such as a fracturing operation. The occurrence of fracture stress interference can increase the fracture area and enable better heat transfer within a single wellbore which may allow for fewer wells drilled in a large scale geothermal project comprising multiple injection and/or production wells.

Disclosed herein is a method of lowering the economic cost of a geothermal energy system by designing an injection well with a curved wellbore. The geothermal energy system can comprise an injection wellbore, a production wellbore, and a geothermal power station 114 fluidically coupled to both. The injection area of the curved wellbore can be optimized by designing a fracturing operation to promote fracture interference between stages. The curved wellbore path can include a sinusoidal path or a helical path to further promote fracture interference between stages and increase the injection area of the injection wellbore. The optimization of the injection area can increase the temperature and flowrate of the production fluid via the conductive fracture output and contact time of the injection fluid from the subterranean formation. The increase in the temperature and flowrate of the production fluid can increase the economic value of the geothermal energy system.

Figure 2B:
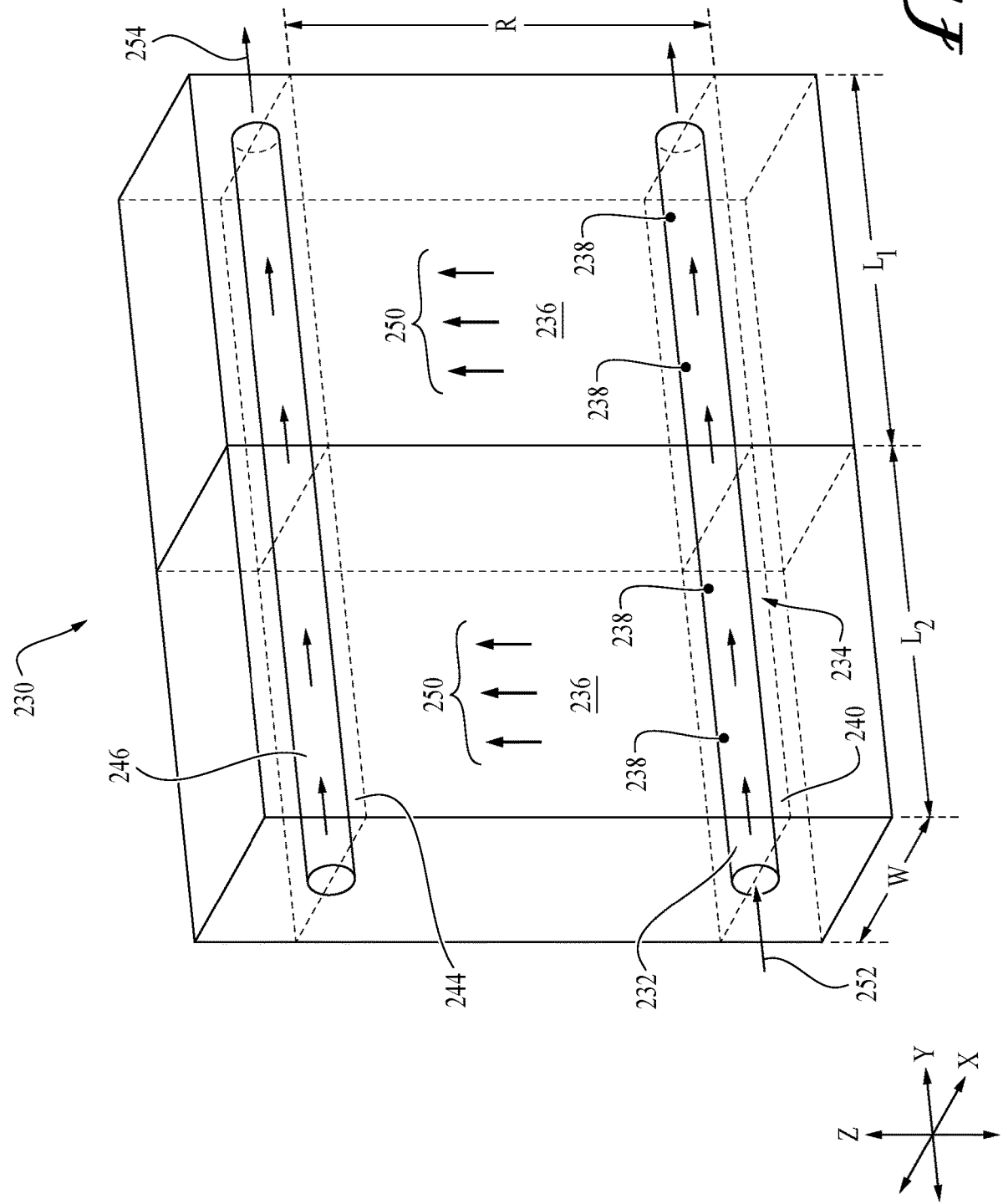
FIG. 2B is a perspective view of a geothermal system according to an embodiment of the disclosure.

Turning now to FIGS. 2A and 2B, a method for designing a geothermal energy system is illustrated as a logical block diagram. In some embodiments, a method 200 for designing a geothermal system with an injection area of the injection well greater than a production area of the production wellbore can be described. A design process 200 can utilize a fracture model and a production model to determine an economic cost value of producing a heated fluid for use in a geothermal power plant, e.g., power plant 114 from FIG. 1. In some embodiments, the design process 200 can compare an economic cost value of a conventional geothermal system comprising an injection well with a generally straight and/or horizontal injection well to an improved geothermal system comprising an injection well with a curved wellbore path.

Turning now to FIG. 2B, a conventional geothermal system 230 can be described. The conventional geothermal system can comprise an injection wellbore 232 with a generally straight and/or horizontal wellbore path 234 penetrating a subterranean formation 236 suitable for geothermal energy production, e.g., dry hot rock. The injection wellbore 232 can comprise a drilled wellbore (not shown), a casing string (shown), a cement sheath (not shown), or any combination thereof. The drilled wellbore and cement sheath are not illustrated for clarity. The injection wellbore 232 can comprise a plurality of initiation points 238.

At block 210 of FIG. 2A, the design process 200 can determine a fracture area 240 for an injection wellbore 232 with a fracture model. The fracture area 240 comprises a projected area of the volume of fracturing fluids extending into the subterranean formation 236. The volume of fracturing fluids from a fracturing operation induces a set of fracture stresses within the subterranean formation 236. The fracture area 240 can be approximated by a planar surface with a unit length "L" and a unit width "W." The fracture model can determine the fracture area 240 from the injection wellbore geometry, a set of geomechanical data for the subterranean formation 236, a first fracturing operation, or combinations thereof. The set of geomechanical data comprises formation composition, porosity, depth, temperature, fracture plane orientation, or combinations thereof. The injection wellbore geometry comprises a borehole, a casing string, a cement sheath, or combinations thereof.

Created fracture area is the surface area of the fracture faces that are created during the hydraulic fracturing process, typically measured in square feet. Since each fracture has 2 faces, the effective fracture area created can simplistically be thought of as the created fracture length times the created fracture height time 2. This would be applied to every fracture that is created within the rock volume. The total created fracture area would be the sum of all of the created fracture area.

In some embodiments, the first fracturing operation comprises a completion operation and a pumping operation for a plurality of fracturing stages. The completion operation comprises a wellbore operation to open a plurality of initiation points 238 in the casing string, e.g., injection wellbore 232. The pumping operation comprises pumping a fracturing fluid according to a pumping schedule into the wellbore geometry of the injection well. The fracturing fluid can comprise a carrier fluid, e.g., water, and a proppant, e.g., ceramic particles. In some embodiments, the proppant can be ceramic particles and/or spheres made from crush and temperature resistant materials, for example, sintered bauxite, kaolin, magnesium silicate, or combinations, e.g., blends, thereof. In some embodiments, a thermally stable coating may be added to the outside of the ceramic particles. The pumping schedule can include a plurality of steps or intervals to place a designation volume of fracturing fluid at a predetermined pumping pressure, flowrate, and concentration of proppant into the subterranean formation 236. In some embodiments, the completion operation can open a plurality of initiation points 238 for a fracturing stage, for example, a first fracturing stage. The pumping operation can fracture the formation 236 by injecting the fracturing fluids into the formation 236 via the initiation points 238. The fracturing operation can be designed to generate a predetermined level of fracture stress within the formation 236. In some embodiments, the fracturing operation opens a plurality of fracture initiation points, initiation points 238, corresponding to a portion of the injection wellbore 232 referred to as a fracture stage. In some embodiments, the unit length "L" can be a fracture stage. For example, FIG. 2B can illustrate a first fracture stage "L1" and a second fracture stage "L2."

At block 212 of FIG. 2A, the design process 200 can determine a production area 244 for a production wellbore 246 with a fracture model. The production area 244 can be determined by the first fracturing operation of the injection wellbore 232, a second fracturing operation of the production wellbore 246, or combinations thereof. In some embodiments, the drilled wellbore for the production wellbore 246 can be located within the fracture stresses of the first fracturing operation for the injection wellbore 232. For example, the production wellbore 246 can be located within the fracture stresses extending from the initiation points 238 of the injection wellbore 232 when the distance "R" from injection wellbore 232 to the production wellbore 246 is a small value. In some embodiment, the drilled wellbore for the production wellbore 246 can be located outside of the fracture stresses of the first fracturing operation for the injection wellbore 232, for example, when the distance "R" from injection wellbore 232 to the production wellbore 246 is a large value. In some embodiments, a second fracturing operation can open initiation points (not shown) in the production wellbore, place a filtering media within the production wellbore 246, create a second set of fracture stresses with a pumping operation, or combinations thereof. For example, the second fracturing operation can open a set of initiation points with a completion operation, e.g., with perforating guns. In another scenario, the second fracturing operation can open a set of initiation points and place a filtering media into the production wellbore, e.g., sand screens and/or filter media. In still another scenario, the second fracturing operation can further comprise a pumping operation to generate fracture stresses extending from the initiation points within the production wellbore 246.

The production area 244 of the production wellbore 246 can be determined by inputting the second wellbore geometry, e.g., production wellbore 246 and the second fracturing operation into the fracture model. The second wellbore geometry comprises a generally horizontal wellbore path that is i) located within the plurality of fracture stresses of the first fracturing operation, ii) located outside of the plurality of fracture stresses of the first fracturing operation, or combinations thereof. The second fracturing operation can include opening a plurality of initiation points within the production wellbore 246, placing a filter media inside the production wellbore 246, a pumping operation to place a fracturing fluid into the formation 236, or combinations thereof.

At block 214 of FIG. 2A, the design process 200 can determine a conductive fracture flowrate 250 from the first wellbore, e.g., the injection wellbore 232, to the second wellbore 246, e.g., the production wellbore 246, with a production model. The conductive fracture flowrate 250 can be a function of the injection pressure at the formation face in the injection well, the flowrate of the injection fluid 252, the fracture stress value of the first fracturing operation, the fracture stress value of the second fracturing operation, or combinations thereof and the inlet pressure of the production well. For example, the differential pressure from the injection well, e.g., injection pressure of the injection fluid, and production well, e.g., production pressure of the production fluid, that drives the injection fluid from the injection well across the fracture stress within the subterranean formation to the producing well and the conductivity of the created fracture, e.g., fracture stress, that determines the flow rate of the fluid that can be established for the given pressure differential. The production model can output a temperature, a pressure, and a flowrate of the production fluid 254.

At block 216 of FIG. 2A, the design process 200 can determine an economic value of the production fluid 254 as a function of the properties of the injection fluid 252 and the properties of the production fluid 254. For example, the economic value of the production fluid 254 may be based on the temperature and the flowrate of the production fluid 254 minus the cost of pumping the injection fluid 252 into the injection wellbore 232. In some embodiments, the economic value of the production fluid 254 can include the price of the electricity produced by the power generation, e.g., power generation 114.

At block 218, the design process 200 can output the design of the injection wellbore 232 and the design of the production wellbore 246 in response to the economic value being greater than a threshold value, the economic cost being lower than a threshold value, or combinations thereof. In some embodiments, the design of the injection wellbore 232 comprises the wellbore geometry, the wellbore path, a first fracturing operation, or combinations thereof. In some embodiments, the design of the production wellbore 246 comprises the production wellbore geometry, the production wellbore path, the second fracturing operation, or combinations thereof.

The economic value of the production fluid 254 can be increased with a curved wellbore path. Turning now to FIG. 2C, an improved geothermal system 270 with a curved wellbore can be described. In some embodiments, the improved geothermal system 270 comprises an injection wellbore 272 with a curved wellbore path 274 penetrating a subterranean formation 236 suitable for geothermal energy production, e.g., dry hot rock. The curved wellbore path 274 can be sinusoidal in shape with an amplitude and period. The amplitude of the sinusoidal wellbore path 274 can be half the distance "T." The period of the sinusoidal wellbore path 274 can be the combined length of "L1" and "L2." The injection wellbore 272 can comprise a drilled wellbore, a casing string, a cement sheath, or any combination thereof. The injection wellbore 272 is illustrated with only a casing string for clarity. The injection wellbore 272 can comprise a plurality of initiation points 278.

Returning to the design process 200 in FIG. 2A, the design process 200 can determine a fracture area 280 for an injection wellbore 272 with a fracture model. The fracture model can determine the fracture area 280 from the injection wellbore geometry, a set of geomechanical data for the subterranean formation 236, a first fracturing operation, or combinations thereof. The first fracturing operation can include a completion operation to open a plurality of initiation points 278 in the casing string, e.g., injection wellbore 272, and a pumping operation. The pumping operation can be designed to promote fracture interference between each initiation point 278 of the plurality of initiation points 278, between fracture stages, e.g., "L1" and "L2", or both. For example, the curved wellbore path 274 can promote fracture interference between the fracture stresses extending from the initiation points 278 and from fracture stage "L1" and fracture stage "L2." The term fracture interference refers to the response of a second fracture plume, e.g., second fracture stress, extending from a fracture initiation point 278 in the casing string to move away from an existing or a first fracture plume, e.g., first fracture stress, and into a portion of the formation 236 that has not been fractured or is without a volume of fracture stress. The curved wellbore path 274 with the predetermined fracture interference of the fracture stresses extending from the initiation points 278 can increase the fracture area 280 of the injection wellbore 272.

At block 212, the design process 200 can determine a production area 244 for a production wellbore 246 with a fracture model. The production area 244 can be determined by the first fracturing operation of the injection wellbore 272, a second fracturing operation of the production wellbore 246, or combinations thereof. The production area 244 can be a function of the occurrence of fracture interference when the production wellbore 246 intersects or is proximate to the fracture stresses extending from the initiation points 278 of the injection wellbore 272. The production area 244 of the production wellbore 246 can be determined by inputting the second wellbore geometry, e.g., production wellbore 246 and the second fracturing operation into the fracture model.

At block 214, the design process 200 can determine a conductive fracture flowrate 284 from the first wellbore, e.g., the injection wellbore 272, to the second wellbore 246, e.g., the production wellbore 246, with a production model. The conductive fracture flowrate 284 can be a function of the pressure and the flowrate of the injection fluid 252, the fracture stress value of the first fracturing operation, the fracture stress value of the second fracturing operation, or combinations thereof. The contact time for the injection fluid 252 within the formation can be a function of the fracture area. For example, the contact time for the injection fluid 252 within the formation can be increased as a result of the increase in fracture area 280 in response to the curved wellbore path 274. The production model can output a temperature, a pressure, and a flowrate of the production fluid 288.

At block 216, the design process 200 can determine an economic value of the production fluid 288 as a function of the properties of the injection fluid 252 and the properties of the production fluid 288. For example, the economic value of the production fluid 288 may be based on the temperature and the flowrate of the production fluid 288 minus the cost of pumping the injection fluid 252 into the injection wellbore 272. In some embodiments, the economic value of the production fluid 288 can include the price of the electricity produced by the power generation, e.g., power generation 114.

At block 218, the design process 200 can output the design of the injection wellbore 272 with the curved wellbore path 274 and the design of the production wellbore 246 in response to the economic value being greater than a threshold value, the economic cost being lower than a threshold value, or combinations thereof. In some embodiments, the design of the injection wellbore 272 comprises the wellbore geometry, the curved wellbore path 274, a first fracturing operation, or combinations thereof. In some embodiments, the design of the production wellbore 246 comprises the production wellbore geometry, the production wellbore path, the second fracturing operation, or combinations thereof.

In some embodiments, the design process 200 can compare the fracture area 240 generated by the geothermal system 230 to the fracture area 280 generated by the improved geothermal system 270. For example, the design process 200 may determine that the fracture area 280 generated by the curved wellbore path 274 is 300 percent larger than the fracture area 240 generated by the straight wellbore path 234. In some embodiments, the design process 200 can optimize the fracture area 280 generated by the curved wellbore path 234 to be a predetermined design value greater than the fracture area 240 of the straight wellbore path 234. For example, the design process 200 may iterate the shape of the curved wellbore path 274, the number of fracture stages, e.g., "L2", the number of initiation points 278, the pumping schedule of the first fracturing operation, or combinations thereof to achieve the design value, e.g., 250 percent. The design value may be 150, 160, 170, 180, 190, 200, 210, 220, 230, 240, 250 percent or any percentage greater than 150 percent.

In some embodiments, the design process 200 can iterate the fracture area 280 generated by the improved geothermal system to achieve an economic value of the production fluid 288. For example, the design process 200 may iterate the shape of the curved wellbore path 274, the number of fracture stages, e.g., "L2", the number of initiation points 278, the pumping schedule of the first fracturing operation, or combinations thereof to achieve an economic value of the production fluid 288.

The shape of the curved wellbore path 274 can be a sinusoidal or a helical shape to increase the occurrence of stress interference between fracture locations and/or fracture stages. Turning now to FIG. 3A, a perspective view of a horizontal sinusoidal injection well environment 300 can be described. In some embodiments, a horizontal sinusoidal injection well 310 can comprise a wellbore drilled with a sinusoidal path into a target hot rock formation 320. A casing string 312 can extend from an injection wellhead 128 at surface 122 into and throughout the wellbore with the sinusoidal path. A cement sheath can be placed between the wellbore and the casing string 312 to anchor and isolate the casing string 312 from the wellbore fluids. Although the wellbore and cement barrier is not illustrated, it is understood that the casing string 312 traverses the sinusoidal wellbore path and the cement may extend from the surface to the toe of the wellbore, e.g., end of casing. As used herein, the term sinusoidal wellbore path comprises a wellbore drilled with any suitable drilling system, a casing string 312, and a cement sheath placed between the wellbore and the casing string 312.

In some embodiments, the injection well 310 comprises a vertical section 324, and a sinusoidal wellbore path 322 extending along a horizontal X-Y plane. The vertical section 324 can be coupled to the wellbore path 322 by a first transition section 328. The sinusoidal wellbore path 322 comprises a first horizontal section 330, a second horizontal section 334, a third horizontal section 338, a fourth horizontal section 342, a fifth horizontal section 346, and a sixth horizontal section 350 generally traversing through the formation 320 along the X-Y plane. The first horizontal section 330 can be coupled to the second horizontal section 334 by a second transition section 332. The second horizontal section 334 can be coupled to the third horizontal section 338 by a third transition section 336. The third horizontal section 338 can be coupled to the fourth horizontal section 342 by a fourth transition section 340. The fourth horizontal section 342 can be coupled to the fifth horizontal section 346 by a fifth transition section 344. The fifth horizontal section 346 can be coupled to the sixth horizontal section 350 by a sixth transition section 348.

The sinusoidal wellbore path 322 can generally follow a sine wave pattern along a y-axis 352 with an amplitude and a period. The amplitude "A" can be defined as half the distance from a first exemplary transition to a second exemplary transition in the x-axis direction of the X-Y plane. For example, the amplitude "A" can be half the distance from the third transition 336 to the fourth transition 340 and can coincide with the y-axis 352 when the third transition 336 and fourth transition 340 are equidistant from the y-axis 352. Although the amplitudes of the sinusoidal wellbore path 322 are illustrated as equivalent, it is understood that the amplitudes from one transition to another transition may vary during the drilling operation for the wellbore.

The period "P" can be defined as the distance in the y-direction of the X-Y plane for the wellbore path to start at a first exemplary location, e.g., a first exemplary transition, to cross the y-axis 352, to travel through an exemplary transition, to cross the y-axis 352, and stop at a second exemplary location, e.g., a second exemplary transition. For example, the period "P" can be a lateral distance parallel to the y-axis 352 from the third transition 336 to the fifth transition 344 and can coincide with the y-axis 352. Although the periods of the sinusoidal wellbore path 322 are illustrated as equivalent, it is understood that the periods from one transition to another transition (on the same side of the y-axis 352) may vary during the drilling operation for the wellbore.

Although the exemplary sinusoidal injection well 310 in FIG. 3A is illustrated with five horizontal sections, e.g., section 334, and 5 transition sections, e.g., transition section 340, it is understood that the sinusoidal injection well 310 can comprise any number of horizontal sections and complementary transition sections, for example, the sinusoidal injection well 310 may comprise 2, 3, 4, 5, 6, 7, 8, 9, 10, or more horizontal sections and complementary transition sections.

The exemplary sinusoidal injection well 310 in FIG. 3A is illustrated with a casing string 312 but without the cement sheath and the wellbore for clarity. Although the sinusoidal wellbore path 322 is illustrated as traversing horizontally along the X-Y plane, it is understood that the sinusoidal wellbore path 322 may also deviate or undulate upwards and downwards (e.g., towards the surface 122 and away from the surface 122) as the sinusoidal wellbore path 322 is drilled through the formation 320. Likewise, the casing string 312 extending through the wellbore (not shown) drilled along the wellbore path 322 may be centralized or not centralized within the drilled wellbore. Said another way, the casing string 312 may or may not be concentric within the drilled wellbore.

Figure 3B:
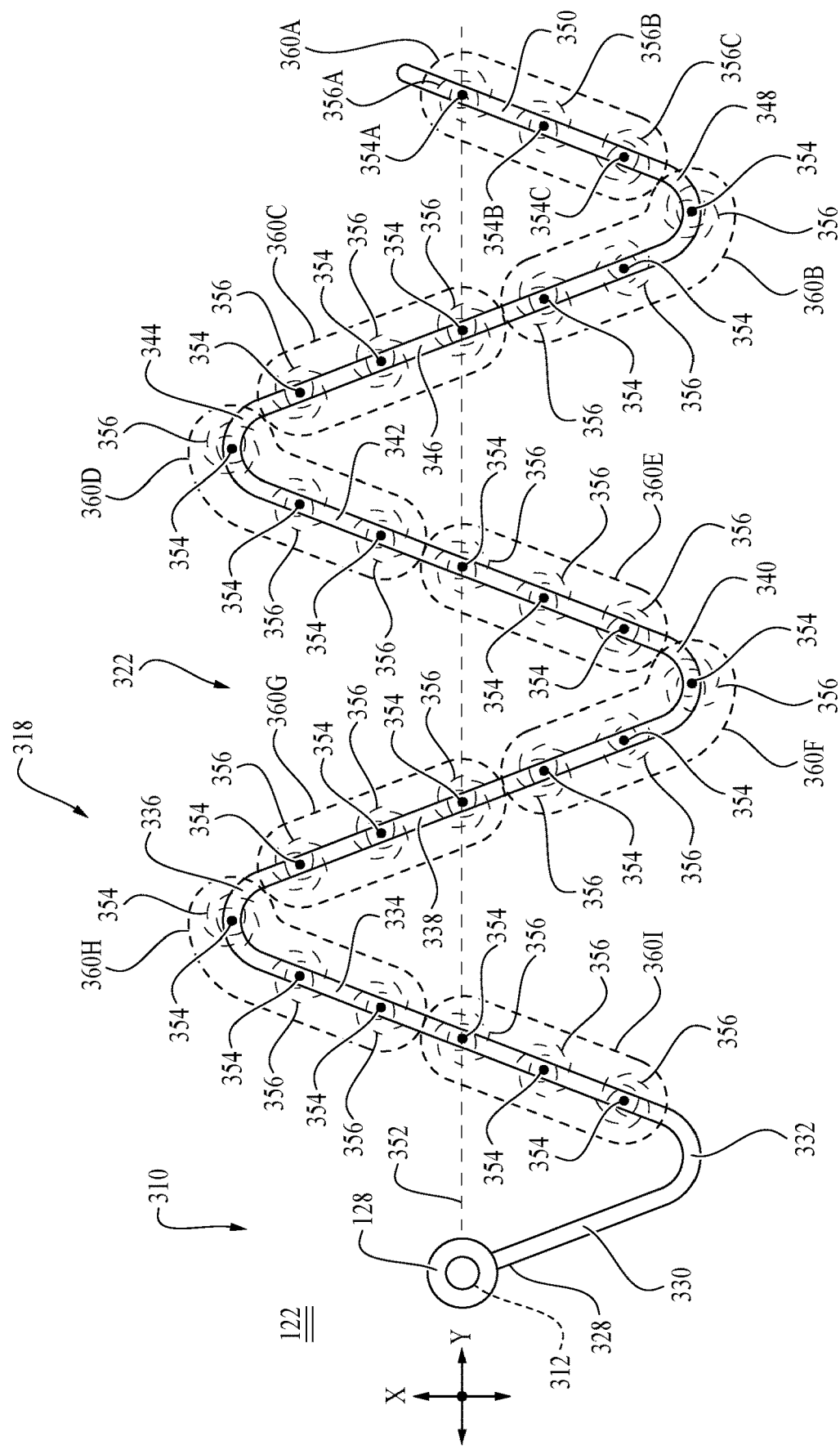
FIG. 3B is a top view of the sinusoidal wellbore with hydraulically induced fractures extending outward in the yz-plane according to another embodiment of the disclosure.
Figure 3C:
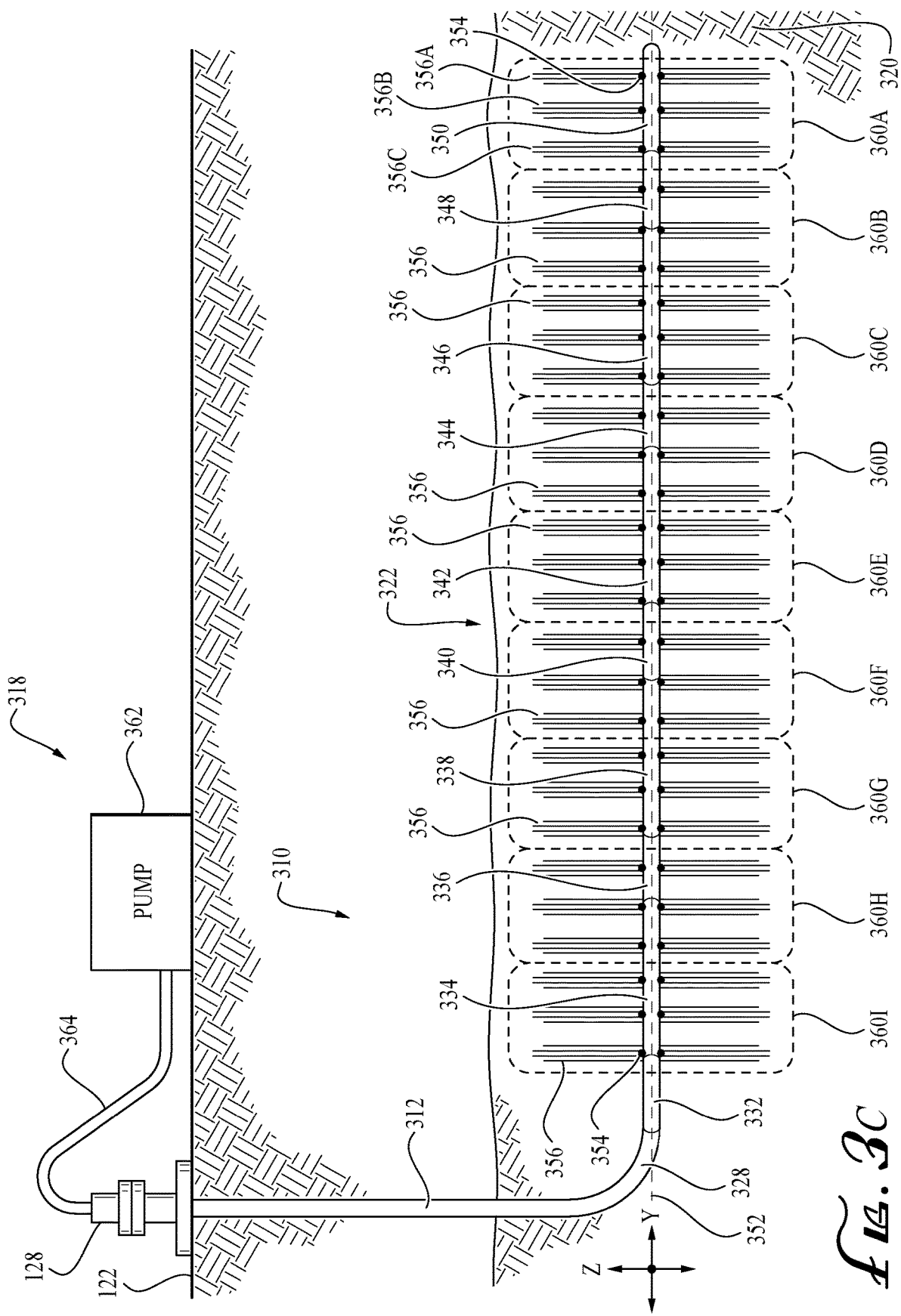
FIG. 3C is a side view of the sinusoidal wellbore with hydraulically induced fractures extending into the vertical plane according to another embodiment of the disclosure.

The horizontal sinusoidal injection well 310 may be hydraulically fractured to improve thermal recovery from the hot rock formation 320. The fracturing operation may be performed in stages comprising pumping a fracturing fluid into a portion of the wellbore open to the formation 320. Turning now to FIGS. 3B and 3C, a top view and side view of a fracturing operation environment 318 of a horizontal sinusoidal injection well 310 can be described. In some embodiments, the injection well 310 can be fractured in stages 360 beginning with a first stage 360A. A downhole tool can be lowered from the surface 122 to the sixth horizontal section 350 to open the casing string 312 to the formation 320. The downhole tool can be lowered through wellhead 128 and interior of the casing string 312 to the target horizontal section, e.g., section 350. The downhole tool can be actuated to open an initiation point 354 and fluidically couple the interior of the casing string 312 to the formation 320. In some embodiments, the downhole tool can be a perforating gun assembly with shape charges that shoots or perforates the casing string 312 and the cement sheath to open or create an initiation point 354 and fluidically couple the interior of the casing string 312 to the formation 320. In some embodiments, each downhole tool can be a shifting tool configured to open a casing valve, e.g., a valve coupled to the casing, to open an initiation point 354 coupled to the casing string 312 to the wellbore, the cement sheath, the downhole environment, or combinations thereof.

Turning now to FIG. 3C, the fracturing operation environment 318 can comprise of a fracturing fleet, e.g., a plurality of pumps 362, coupled to the wellhead 128 via a high pressure line 364 pumping a fracturing fluid according to a pumping schedule, e.g., a sequence of steps comprising fluid volumes and flowrates. The first fracturing operation can produce a facture plume 356, also referred to as a fracture ellipse, through each initiation point 354 in the casing string 312. The stress level of each fracture stress created from each fracture plume 356 can be a function of the volume sand displaced into the formation 320. The illustration of the fracture plume 356 represents the fracture growth of the fracture fluid, e.g., proppant and water, cracking or splitting the hot rock formation 320 and propagating into a vertical fracture plane, e.g., yz-plane. The vertical fracture plane can be generally perpendicular to the horizontal wellbore and/or the axis of the wellbore path 322, e.g., axis 352.

Figure 3D:
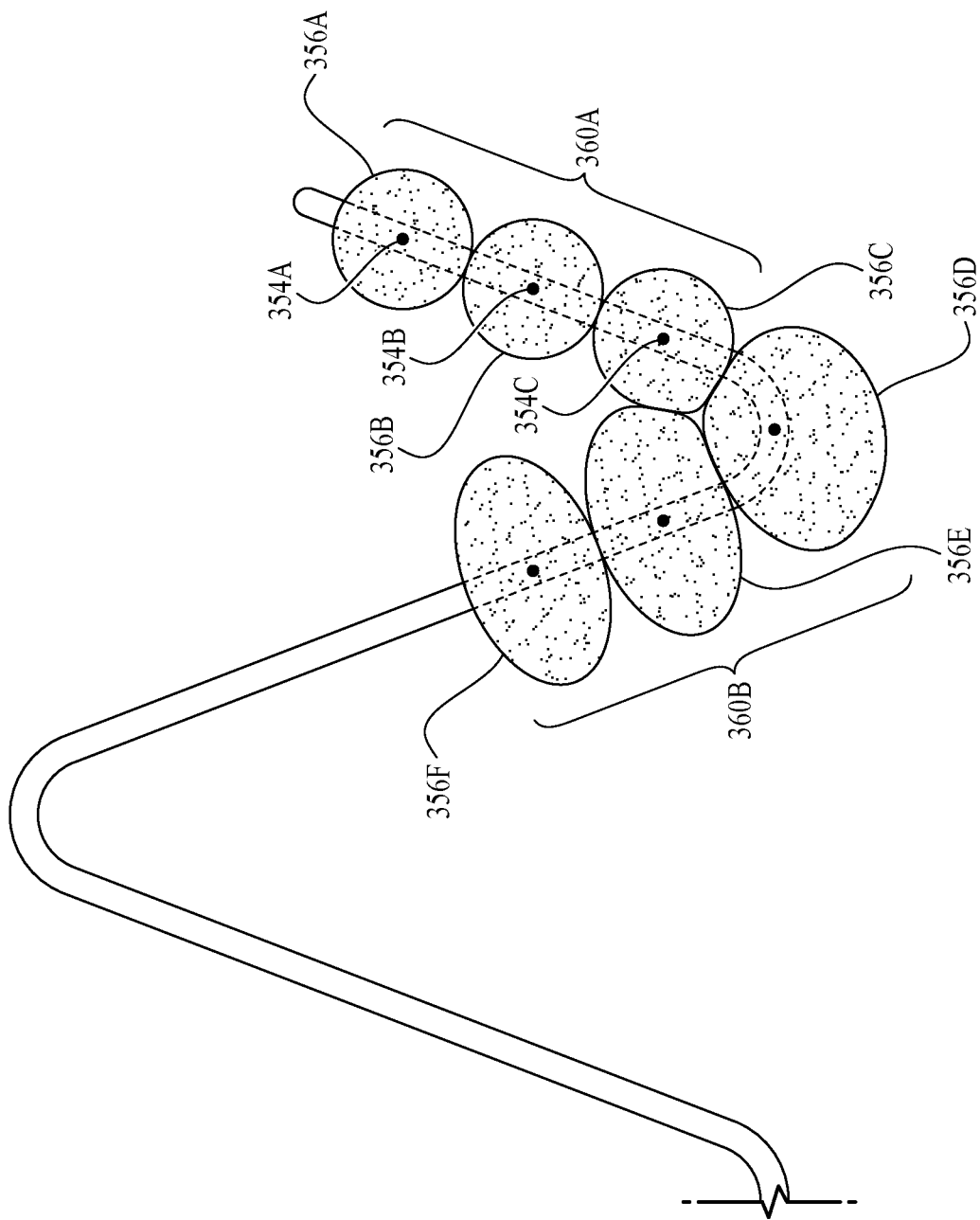
FIG. 3D is a top view of the sinusoidal wellbore detailing fracture interference between fracture stages according to another embodiment of the disclosure.

Turning now to FIG. 3D, a top view of the fracturing operation on a portion of the wellbore path 222 of the injection well 310 can be described. In some embodiments, the fracture operation can generate smaller fracture plumes 356 in the first stage 360A. The first stage 360A can comprise multiple fracture plumes 356A-C extending from a plurality of initiation points 354A-C. The first fracture stage 360A may result in smaller fracture plumes 356, and thus smaller volumes of fracture stress, as the fracturing fluid is entering into an un-stressed rock formation. The fracture plumes 356A-C of the first stage 360A can generate an increased stress level, e.g., fracture stress, within the formation 320. The second fracture stage 360B can generate larger fracture plumes 356 extending from each of the initiation points 354. The fracture plumes 356A-C of the first fracture stage 360A can interfere with the fracture plumes 356D-F of the second fracture stage 360B. The fracture interference of a previous fracture stage, e.g., stage 360A, can result in the fracture plumes, e.g., plumes 356D-F, of the current stage growing larger and moving away from the plumes or fracture stress, e.g., plumes 356A-C, of the previous stage. The fracturing operation can be designed to increase the fracture area, e.g., fracture area 280, of the injection well 310 by promoting fracture interference between fracture plumes 356.

Returning to FIGS. 3B and 3C, the fracturing operation can continue from the second fracturing stage 360B to the third fracturing stage 360C and continue until all fracturing stages 360A-I are completed. The fracturing operation can be designed to increase the fracture area, e.g., fracture area 280, of the injection well 310 with fracture interference between fracture stages 360. The number of initiation points 354 and the pump schedule may vary for each fracture stage, e.g., stage 260F, as determined by the design process 200. For example, a fracture stage close to a transition, e.g., transition 340, may have a different number of initiation points 354 and/or a different pump schedule than a fracture stage away from a transition, e.g., stage 260I. Although only three initiation points 354A-C and fracture plumes 356A-C for each stage 360A-I are illustrated, it is understood that each fracture stage 360 can comprise 1, 2, 3, 4, 5, 6, 7, 8, 9, 10, or any number of initiation points 354 and fracture plumes 356.

Figure 3E:
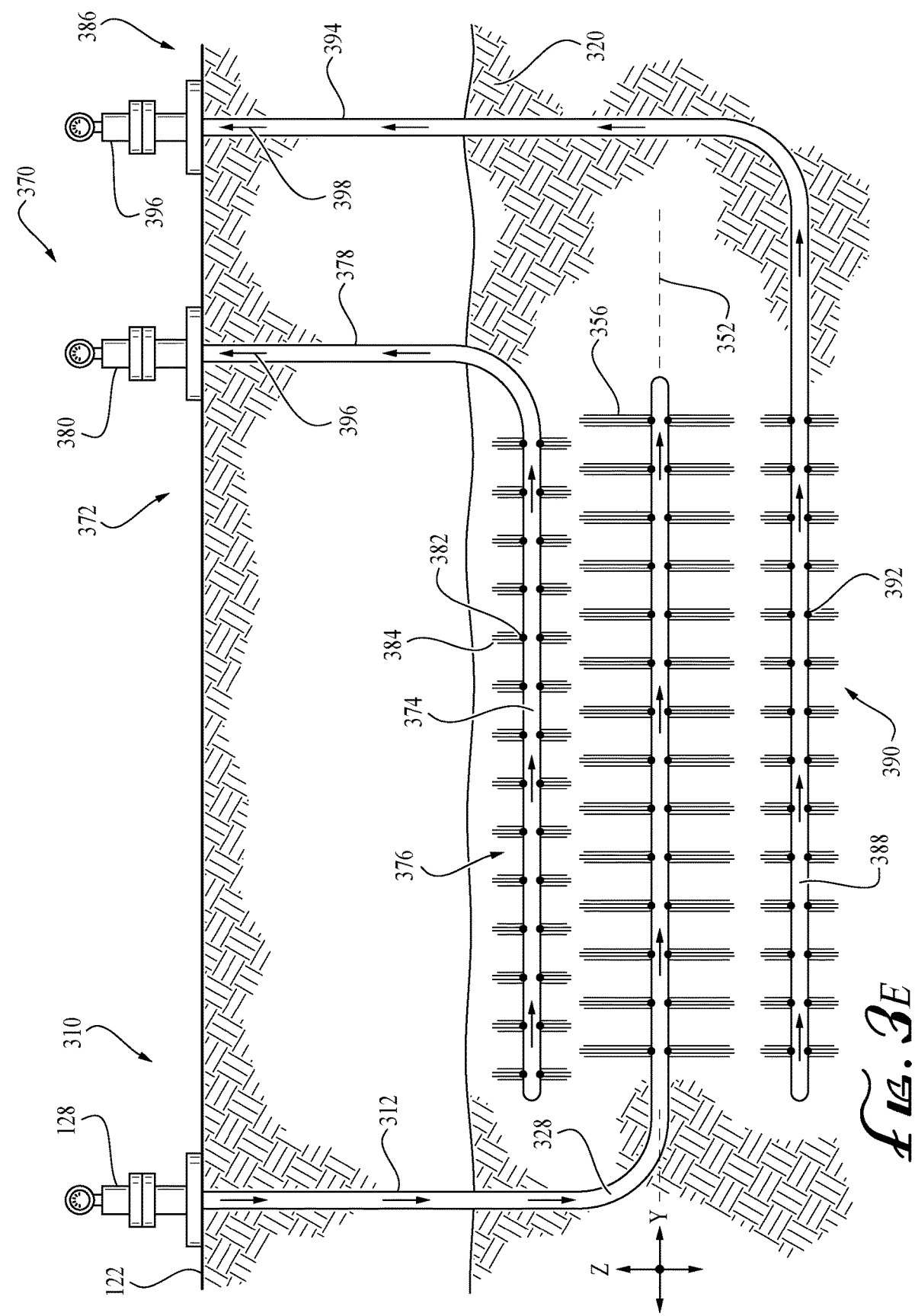
FIG. 3E is a side view of the sinusoidal wellbore with hydraulically induced fractures and one or more production wells according to another embodiment of the disclosure.

Turning now to FIG. 3E, a partial sectional view of a geothermal production environment 370 can be described. In some embodiments, a geothermal production system can comprise a least one injection well 310 and at least one production well 372. The production well 372 can be designed by the design process 200 previously described. The production well 372 can comprise a production wellbore 374, a vertical portion 378, and a first production wellhead 380. The production wellbore 374 can include a generally horizontal wellbore path 376 extending into the formation 320. In some embodiments, the production wellbore 374 can comprise a plurality of initiation ports 382. In some embodiments, the production wellbore 374 can further comprise a plurality of fracture plumes 384 extending into the formation 320. The production wellbore 374 of the first production well 372 can be within or proximate to the fracture plumes 356 of the injection well 310.

In some embodiments, the geothermal production system can comprise a second production well 386. The second production well 386 can be designed by the design process 200 previously described. The second production well 386 can comprise a second production wellbore 388, a vertical portion 394, and a second production wellhead 396. The second production wellbore 388 can include a generally horizontal wellbore path 390 extending into the formation 320. In some embodiments, the second production wellbore 388 can comprise a plurality of initiation ports 392. In some embodiments, the second production wellbore 388 can further comprise a plurality of fracture plumes extending into the formation 320. The second production wellbore 388 of the second production well 386 can be located away from or out of the influence of the fracture plumes 356 of the injection well 310.

In some embodiments, the economic value of the production fluid 396 of the first production well 372 and the production fluid 398 of the second production well 386 can be determined by the design process 200. In an example, the design process 200 may determine the placement of the first production wellbore 374 proximate to the fracture plumes 356 results in a production fluid 396 with an economic value below a threshold value. In another scenario, the design process 200 may determine the placement of the second production wellbore 388 away from or distal to the fracture plumes 356 results in a production fluid 398 with an economic value above a threshold value. In still another scenario, the design process 200 may determine that the economic value of the first production fluid 396 and second production fluid 398 are below a threshold value and recommend that the wellbore path 322 of the injection wellbore be modified to increase the contact time for the injection fluid within the formation 320.

Although the previous example comprised the curved wellbore path in the horizontal plane, the curved wellbore path can be a sinusoidal shape in the vertical plane. Turning now to FIG. 4A, a perspective view of a vertical sinusoidal injection well environment 400 can be described. In some embodiments, a vertical sinusoidal injection well 410 can comprise a wellbore drilled with a vertical sinusoidal path into a target hot rock formation 420. The vertical sinusoidal wellbore can comprise a casing string 412, a cement sheath, and a drilled wellbore. The vertical sinusoidal wellbore can extend from an injection wellhead 128 at surface 122 into a formation 420.

In some embodiments, the injection well 410 comprises a vertical section 424, and a sinusoidal wellbore path 422 extending along a vertical Y-Z plane. The vertical section 424 can be coupled to the wellbore path 422 by a first transition section 428. The sinusoidal wellbore path 422 comprises a first vertical section 430, a second vertical section 434, a third vertical section 438, a fourth vertical section 442, a fifth vertical section 446, and a sixth vertical section 450 generally traversing through the formation 420 along the Y-Z plane. The first vertical section 430 can be coupled to the second vertical section 434 by a second transition section 432. The second vertical section 434 can be coupled to the third vertical section 438 by a third transition section 436. The third vertical section 438 can be coupled to the fourth vertical section 442 by a fourth transition section 440. The fourth vertical section 442 can be coupled to the fifth vertical section 446 by a fifth transition section 444. The fifth vertical section 446 can be coupled to the sixth vertical section 450 by a sixth transition section 448.

The sinusoidal wellbore path 422 can generally follow a sine wave pattern along a y-axis 452 with an amplitude and a period. The amplitude "A" can be defined as half the distance from a first exemplary transition to a second exemplary transition in the z-axis direction of the Y-Z plane. For example, the amplitude "A" can be half the distance from the third transition 436 to the fourth transition 440 and can coincide with the y-axis 452 when the third transition 436 and fourth transition 440 are equidistant from the y-axis 452. Although the amplitudes of the sinusoidal wellbore path 422 are illustrated as equivalent, it is understood that the amplitudes from one transition to another transition may vary during the drilling operation for the wellbore.

The period "P" can be defined as the distance in the y-direction of the Y-Z plane for the wellbore path to start at a first exemplary location, e.g., a first exemplary transition, to cross the y-axis 452, to travel through an exemplary transition, to cross the y-axis 452, and stop at a second exemplary location, e.g., a second exemplary transition. For example, the period "P" can be a lateral distance parallel to the y-axis 452 from the third transition 436 to the fifth transition 444 and can coincide with the y-axis 452. Although the periods of the sinusoidal wellbore path 422 are illustrated as equivalent, it is understood that the periods from one transition to another transition (on the same side of the y-axis 452) may vary during the drilling operation for the wellbore.

Although the exemplary sinusoidal injection well 410 in FIG. 4A is illustrated with five vertical sections, e.g., section 434, and 5 transition sections, e.g., transition section 440, it is understood that the sinusoidal injection well 410 can comprise any number of vertical sections and complementary transition sections, for example, the sinusoidal injection well 410 may comprise 2, 3, 4, 5, 6, 7, 8, 9, 10, or more vertical sections and complementary transition sections.

Turning now to FIG. 4B, a top view of a geothermal production environment 460 can be described. In some embodiments, a geothermal production system can comprise a least one injection well 410 and at least one production well 462. The production well 462 can be designed by the design process 200 previously described. The production well 462 can comprise a production wellbore 464, a vertical portion 466, and a first production wellhead 468. The production wellbore 464 can include a generally horizontal wellbore path 470 extending into the formation 420. In some embodiments, the production wellbore 464 can comprise a plurality of initiation ports 472 and can be within or proximate to the fracture plumes 476 of the injection well 410.

In some embodiments, a fracturing operation can create a plurality of fractures within formation 420 after at least one production well, production well 462, is completed. For example, the injection well 410 can be drilled and completed with a string of casing and supported with a cement sheath. The completion of the injection well 410 can be followed by the drilling and completion of the production well 462. In some embodiments, a fracturing operation can be performed on the injection well 410 while monitoring the fracture propagation with sensors placed inside the production well 462. In some embodiments, the fracture operation on both the injection well 410 and the production well 462 can be performed simultaneously. For example, a first fracture stage can be pumped from the injection well 410 followed by a second fracture stage pumped from the production well 462.

In some embodiments, the fracture operation can comprise fracturing the injection well 410 while taking returns from the production well 462.

As previously described, the fracturing operation can comprise of a fracturing fleet, e.g., a plurality of pumps 362, coupled to the injection wellhead 128 to deliver a fracturing fluid according to a pumping schedule, e.g., a sequence of steps comprising fluid volumes and flowrates. The first fracturing operation can include a completion operation to open a plurality of initiation points 478 along the sinusoidal wellbore. The first fracturing operation can produce a plurality of facture plumes 476 through each initiation point 478 in the casing string 412. The stress level of each fracture stress created from each fracture plume 476 can be a function of the volume of sand displaced into the formation 420. The illustration of the fracture plume 476 represents the fracture growth of the fracture fluid, e.g., proppant and water, cracking or splitting the hot rock formation 420 and propagating into a horizontal fracture plane, e.g., xy-plane. The horizontal fracture plane can be generally parallel to the horizontal wellbore and/or the axis of the wellbore path 422, e.g., axis 452.

In some embodiments, the geothermal production system can comprise a second production well 480. The second production well 480 can be designed by the design process 200 previously described. The second production well 480 can comprise a second production wellbore 484, a vertical portion 488, and a second production wellhead 482. The second production wellbore 484 can include a generally horizontal wellbore path 486 extending into the formation 420. In some embodiments, the second production wellbore 484 can comprise a plurality of initiation ports 490. In some embodiments, the second production wellbore 484 can further comprise a plurality of fracture plumes extending into the formation 420. The second production wellbore 484 of the second production well 480 can be located away from or out of the influence of the fracture plumes 476 of the injection well 410.

Turning now to FIG. 5A, a perspective view of a helical injection well environment 500 can be described. In some embodiments, a helical injection well 510 can comprise a wellbore drilled with a horizontal helical path into a target hot rock formation 520. The horizontal helical wellbore can comprise a casing string 512, a cement sheath, and a drilled wellbore. The helical wellbore can be coupled to an injection wellhead 128 at surface 122 by a vertical section 524.

In some embodiments, the injection well 510 comprises a helical wellbore path 522 extending along a wellbore axis, e.g., y-axis 552. The vertical section 424 can be coupled to the helical wellbore path 522 by a first transition section 528. The helical wellbore path 522 comprises a curved section 530 extending from a wellbore axis 552 by a radial distance "R." The curved section 530 can travel a longitude distance "P" along the wellbore axis 552 for each 360 degree revolution. Although the curved section 530 of the helical wellbore path 522 is illustrated with 3.25 revolutions, it is understood that the curved section 530 following the helical wellbore path 522 may include 1, 2, 3, 4, 5, 6, 7, 8, 9, 10 or any whole number of revolutions and/or any fraction of a revolution, for example, 0.10, 0.25, 0.50, 0.75, 0.90, or any fraction between 0 to 1.

Turning now to FIG. 5B, a perspective view of a fracturing operation environment 540 can be described. In some embodiments, a fracturing operation can comprise a fracturing fleet, e.g., a plurality of pumps 362, coupled to the wellhead 128 via a high pressure line 364 pumping a fracturing fluid according to a pumping schedule. A first fracturing operation can produce a facture plume 556, also referred to as a fracture ellipse, through each initiation point 554 in the casing string 512. The stress level of each fracture stress created from each fracture plume 556 can be a function of the volume sand displaced into the formation 520. The illustration of the fracture plume 556 extending generally parallel and/or longitudinally to the wellbore axis 552 represents the fracture growth and propagation into a vertical fracture plane, e.g., yz-plane.

As previously described, the fracturing operation can comprise a plurality of stages and begin with a first stage 560A. The first stage 560A can comprise a plurality of fracture plumes 556A-C extending from a plurality of initiation points 554A-C. The second stage 560B can comprise one or more fracture plumes redirected or displaced by fracture interference from the first stage 560A. The fracturing operation can be designed to increase the fracture area, e.g., fracture area 280, of the injection well 510 by promoting fracture interference between fracture plumes 556.

Turning now to FIG. 5C, a partial sectional view of a geothermal production environment 570 can be described. In some embodiments, a geothermal production system can comprise a least one injection well 510 and at least one production well 572. The production well 572 can be designed by the design process 200 previously described. The production well 572 can comprise a production wellbore 574, a vertical portion 578, and a first production wellhead 580. The production wellbore 574 can include a generally horizontal wellbore path 576 extending into the formation 520. In some embodiments, the production wellbore 574 can comprise a plurality of initiation ports 582. In some embodiments, the production wellbore 574 can further comprise a plurality of fracture plumes 584 extending into the formation 520. As illustrated in FIG. 5C, the plurality of fracture plumes 584, e.g., vertical fractures, can be generated in the direction of the maximum horizontal stress (the Y-direction) and can be longitudinal to the producing wellbore. The plurality of fracture plumes 584, e.g., vertical fractures, may (or may not) actually be longitudinal and may be at an oblique angle to the producing wellbore as they follow the direction of maximum stress. The production wellbore 574 of the first production well 572 can be located within the helical wellbore path 522 of the injection well 510.

In some embodiments, the economic value of the production fluid 596 of the production well 572 can be determined by the design process 200. In an example, the design process 200 may determine the placement of the production wellbore 574 within the helical wellbore path 522 results in a production fluid 596 with an economic value below a threshold value. In another example, the design process 200 may determine the placement of the production wellbore 574 within the helical wellbore path 522 and with a second fracturing operation results in a production fluid 596 with an economic value above a threshold value.

ADDITIONAL DISCLOSURE

The following are non-limiting, specific embodiments in accordance with the present disclosure:

A first embodiment, which is a system for producing geothermal energy from a subterranean formation, comprising: an injection well comprising a curved wellbore extending into the subterranean formation from an injection wellhead at a surface location, wherein the curved wellbore comprises an injection area value greater than an injection area value of a horizontal wellbore; a production well fluidically coupled to the injection well comprising a generally horizontal production wellbore penetrating the subterranean formation from a production wellhead at the surface location, and wherein the production well has a production area value less than the injection area value of the injection well; an energy production system configured to generate electric power from an elevated temperature of a production fluid; and wherein the elevated temperature and flowrate of the production fluid is a function of a pressure and a flowrate of an injection fluid.

A second embodiment, which is the method of the first embodiment, wherein the curved wellbore of the injection well comprises a sinusoidal wellbore path.

A third embodiment, which is the method of any of the first and second embodiment, wherein the curved wellbore of the injection well comprises a helical wellbore path.

A fourth embodiment, which is the method of any of the first through the third embodiments, wherein the curved wellbore with the helical wellbore path is drilled along or generally coincident to a fracture plane of the subterranean formation.

A fifth embodiment, which is the method of any of the first through the fourth embodiments, wherein the generally horizontal production wellbore is located i) above or ii) below the curved wellbore with a sinusoidal wellbore path in a horizontal plane.

A sixth embodiment, which is the method of any of the first through the fifth embodiments, wherein the curved wellbore with a sinusoidal wellbore path in a horizontal plane is drilled perpendicular to a fracture plane of the subterranean formation.

A seventh embodiment, which is the method of any of the first through the sixth embodiments, wherein the generally horizontal production wellbore is located generally parallel to a wellbore axis of the curved wellbore with a sinusoidal wellbore path in a vertical plane.

An eighth embodiment, which is the method of any of the first through the seventh embodiments, wherein the curved wellbore with a sinusoidal wellbore path in a vertical plane is drilled along or generally coincident to a fracture plane of the subterranean formation.

A ninth embodiment, which is the method of any of the first through the eight embodiments, wherein the generally horizontal production wellbore is located generally coincident to a wellbore axis of the curved wellbore with a helical wellbore path.

A tenth embodiment, which is the method of any of the first through the eight embodiments, wherein the energy production system is further configured to: (i) turn a turbine with a steam portion of the production fluid; (ii) flash the production fluid to steam and turn a turbine with the steam; (iii) pass the production fluid through a heat exchanger to transfer heat to a second fluid; flash the second fluid to steam; turn a turbine with the steam from the second fluid; or (iv) combinations thereof; transform the production fluid to the injection fluid via a cooling system; and pump the injection fluid into the subterranean formation via the injection wellhead.

A eleventh embodiment, which is a method of designing a geothermal energy production system, comprising (i) determining a fracture area of an injection well by inputting a first wellbore geometry for the injection well, a set of geomechanical data for a subterranean formation, a first fracturing operation, or combinations thereof into a fracture model, wherein the first wellbore geometry comprises i) a sinusoidal path in a horizontal plane, ii) a sinusoidal path in a vertical plane, or iii) a helical path along a wellbore axis;

(ii) determining a production area of a production well by inputting a second wellbore geometry for the production well, a second fracturing operation, or combinations thereof into the fracture model; (iii) determining a conductive fracture flowrate through the fracture area of the first wellbore geometry to the production area of the second wellbore geometry by inputting an injection fluid flowrate and pressure into a production model; determining an economic value of a production fluid from the production well; iteratively returning to the fracturing model to adjust the first wellbore geometry, the first fracturing operation, or both in response to the economic value of the production fluid being lower than a threshold value; and outputting an injection wellbore geometry, a production wellbore geometry, a first working fracturing operation, a second working fracturing operation, or combinations thereof, in response to the economic value being higher than a threshold value.

An twelfth embodiment, which is the method of the eleventh embodiment, wherein the set of geomechanical data comprises formation composition, porosity, depth, temperature, fracture plane orientation, or combinations thereof.

An thirteenth embodiment, which is the method of any of the eleventh and twelfth embodiment, wherein the subterranean formation is a geothermal formation.

A fourteenth embodiment, which is the method of any of the eleventh through the thirteenth embodiments, wherein the first wellbore geometry further comprises a borehole, a casing string, a cement sheath, or combinations thereof.

A fifteenth embodiment, which is the method of any of the eleventh through the fourteenth embodiments, wherein the first fracturing operation comprises a completion operation configured to open a plurality of initiation points in the first wellbore geometry.

A sixteenth embodiment, which is the method of any of the eleventh through the fifteenth embodiments, wherein the first fracturing operation comprises pumping a fracturing fluid according to a pumping schedule into the first wellbore geometry of the injection well.

A seventeenth embodiment, which is the method of any of the eleventh through the sixteenth embodiments, wherein the first fracturing operation comprises a plurality of fracturing stages; wherein at least one fracture from a first fracturing stage interferes with at least one fracture from the same fracturing stage or a second fracture stage; and wherein the interference with the at least one fracture from the first fracturing stage increases the fracture area of the at least one fracture from the same fracturing stage and/or the second fracturing stage.

A eighteenth embodiment, which is the method of any of the eleventh through the seventeenth embodiments, wherein the fracture area is determined by modeling a plurality of fractures extending from a plurality of initiation points in the first wellbore geometry into the subterranean formation via the first fracturing operation.

A nineteenth embodiment, which is the method of any of the tenth through the eighteenth embodiments, wherein the second wellbore geometry comprises a generally horizontal wellbore path.

A twentieth embodiment, which is the method of any of the tenth through the nineteenth embodiments, wherein the generally horizontal wellbore path is i) located outside of a plurality of fracture stresses of the first fracturing operation, or ii) located within the plurality of fracture stresses of the first fracturing operation.

A twenty-first embodiment, which is the method of any of the tenth through the twentieth embodiments, wherein the second fracturing operation comprises a second completion operation, a second pumping operation, or combinations thereof, wherein a second completion operation comprises i) installing a filter media, ii) opening a plurality of initiation points, or iii) combinations thereof in the second wellbore geometry; and wherein the second pumping operation comprises pumping a fracturing fluid according to a pumping schedule into the second wellbore geometry of the production well.

A twenty-second embodiment, which is the method of any of the tenth through the twenty-first embodiments, wherein the economic value is a function of a pumping flowrate and a pumping pressure of an injection fluid, a contact time for the subterranean formation, a production fluid flowrate, a production fluid temperature, or combinations thereof.

A twenty-third embodiment, which is a method of designing an injection well, comprising determining a design fracture area of the injection well by inputting a design injection wellbore, a set of geomechanical data for a subterranean formation, a design fracturing operation, or combinations thereof into a fracture model, wherein the design injection wellbore comprises a design wellbore path and a design wellbore geometry, wherein the design wellbore path comprises i) a sinusoidal path in a horizontal plane, ii) a sinusoidal path in a vertical plane, or iii) a helical path along a wellbore axis; and iterating the design fracture area of the injection well by modifying the design wellbore path in response to an economic value of a production fluid produced from a production well being below a threshold value.

A twenty-fourth embodiment, which is the method of the twenty-third embodiment, further comprising determining a production area of the production well by inputting a production wellbore, a production wellbore path, a production fracturing operation, or combinations thereof into a fracture model.

A twenty-fifth embodiment, which is the method of any of the twenty-third through the twenty-fourth embodiments, further comprising determining a conductive fracture flowrate from the design injection wellbore to a production wellbore of the production well by inputting a flowrate of an injection fluid into a production model.

A twenty-sixth embodiment, which is the method of any of the twenty-third through the twenty-fifth embodiments, further comprising determining an economic value of a production fluid from the production well based on a flowrate of an injection fluid, a contact time, a production fluid flowrate, a production fluid temperature, or combinations thereof.

A twenty-seventh embodiment, which is the method of any of the twenty-third through the twenty-sixth embodiments, further comprising generating a working injection wellbore path and working fracturing operation in response to the economic value of the production fluid being above a threshold value.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: R=Rl+k*(Ru-Rl), wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. A system for producing geothermal energy from a subterranean formation, comprising:
   an injection well comprising a curved wellbore extending into the subterranean formation from an injection wellhead at a surface location, wherein the curved wellbore comprises an injection area value greater than an injection area value of a horizontal wellbore;
   a production well fluidically coupled to the injection well comprising a horizontal production wellbore penetrating the subterranean formation from a production wellhead at the surface location, and wherein the production well has a production area value less than the injection area value of the injection well;
   an energy production system fluidically coupled to the injection wellhead and the production wellhead configured to generate electric power from an elevated temperature of a production fluid; and
   wherein the elevated temperature and flowrate of the production fluid is a function of a pressure and a flowrate of an injection fluid.

2. The system of claim 1, wherein the curved wellbore of the injection well comprises a sinusoidal wellbore path with a vertical portion coupled to the injection wellhead.

3. The system of claim 1, wherein the curved wellbore of the injection well comprises a helical wellbore path with a vertical portion coupled to the production wellhead.

4. The system of claim 3, wherein the curved wellbore with the helical wellbore path is drilled along or coincident to a fracture plane of the subterranean formation.

5. The system of claim 1, wherein the horizontal production wellbore is located i) above or ii) below the curved wellbore with a sinusoidal wellbore path in a horizontal plane.

6. The system of claim 5, wherein the curved wellbore with a sinusoidal wellbore path in a horizontal plane is drilled perpendicular to a fracture plane of the subterranean formation.

7. The system of claim 1, wherein the horizontal production wellbore is located generally-parallel to a wellbore axis of the curved wellbore with a sinusoidal wellbore path in a vertical plane.

8. The system of claim 7, wherein the curved wellbore with a sinusoidal wellbore path in a vertical plane is drilled along or coincident to a fracture plane of the subterranean formation.

9. The system of claim 1, wherein the horizontal production wellbore is located along a wellbore axis of the curved wellbore with a helical wellbore path.

10. The system of claim 1, wherein the energy production system is further configured to:
    (i) turn a turbine with a steam portion of the production fluid;
    (ii) flash the production fluid to steam and turn a turbine with the steam;
    (iii) pass the production fluid through a heat exchanger to transfer heat to a second fluid;
    flash the second fluid to steam;
    turn a turbine with the steam from the second fluid; or
    (iv) combinations thereof;
    transform the production fluid to the injection fluid via a cooling system; and
    pump the injection fluid into the subterranean formation via the injection wellhead.

11. A method of designing a geothermal energy production system, comprising:
    (i) determining a fracture area of an injection well by inputting a first wellbore geometry for the injection well, a set of geomechanical data for a subterranean formation, a first fracturing operation, or combinations thereof into a fracture model, wherein the first wellbore geometry comprises i) a sinusoidal path in a horizontal plane, ii) a sinusoidal path in a vertical plane, or iii) a helical path along a wellbore axis;
    (ii) determining a production area of a production well by inputting a second wellbore geometry for the production well, a second fracturing operation, or combinations thereof into the fracture model;
    (iii) determining a conductive fracture flowrate through the fracture area of the first wellbore geometry to the production area of the second wellbore geometry by inputting an injection fluid flowrate and pressure into a production model;
    determining an economic value of a production fluid from the production well;
    iteratively returning to the fracturing model to adjust the first wellbore geometry, the first fracturing operation, or both in response to the economic value of the production fluid being lower than a threshold value; and
    outputting an injection wellbore geometry, a production wellbore geometry, a first working fracturing operation, a second working fracturing operation, or combinations thereof, in response to the economic value being higher than a threshold value.

12. The method of claim 11, wherein the set of geomechanical data comprises formation composition, porosity, depth, temperature, fracture plane orientation, or combinations thereof.

13. The method of claim 11, wherein the subterranean formation is a geothermal formation.

14. The method of claim 11, wherein the first wellbore geometry further comprises a borehole, a casing string, a cement sheath, or combinations thereof.

15. The method of claim 11, wherein the first fracturing operation comprises a completion operation configured to open a plurality of initiation points in the first wellbore geometry.

16. The method of claim 11, wherein the first fracturing operation comprises pumping a fracturing fluid according to a pumping schedule into the first wellbore geometry of the injection well.

17. The method of claim 16, wherein:
the pumping schedule of the first fracturing operation comprises a plurality of fracturing stages;
wherein at least one fracture from a first fracturing stage interferes with at least one fracture from a second fracture stage; and
wherein the interference with the at least one fracture from the first fracturing stage increases the fracture area of the at least one fracture from the second fracturing stage.

18. The method of claim 16, wherein the fracture area is determined by modeling a plurality of fractures extending from a plurality of initiation points in the first wellbore geometry into the subterranean formation via the first fracturing operation.

19. The method of claim 11, wherein the second wellbore geometry comprises a horizontal wellbore path.

20. The method of claim 19, wherein the horizontal wellbore path is i) located outside of a plurality of fracture stresses of the first fracturing operation, or ii) located within the plurality of fracture stresses of the first fracturing operation.

21. The method of claim 11, wherein the second fracturing operation comprises a second completion operation, a second pumping operation, or combinations thereof;
wherein a second completion operation comprises i) installing a filter media, ii) opening a plurality of initiation points, or iii) combinations thereof in the second wellbore geometry; and
wherein the second pumping operation comprises pumping a fracturing fluid according to a pumping schedule into the second wellbore geometry of the production well.

22. The method of claim 11, wherein the economic value is a function of a pumping flowrate and a pumping pressure of an injection fluid, a contact time for the subterranean formation, a production fluid flowrate, a production fluid temperature, or combinations thereof.

23. A method of designing an injection well, comprising:
determining a design fracture area of the injection well by inputting a design injection wellbore, a set of geomechanical data for a subterranean formation, a design fracturing operation, or combinations thereof into a fracture model, wherein the design injection wellbore comprises a design wellbore path and a design wellbore geometry, wherein the design wellbore path comprises i) a sinusoidal path in a horizontal plane, ii) a sinusoidal path in a vertical plane, or iii) a helical path along a wellbore axis; and
iterating the design fracture area of the injection well by modifying the design wellbore path in response to an economic value of a production fluid produced from a production well being below a threshold value.

24. The method of claim 23, further comprises:
determining a production area of the production well by inputting a production wellbore, a production wellbore path, a production fracturing operation, or combinations thereof into a fracture model.

25. The method of claim 23, further comprises:
determining a conductive fracture flowrate through the fracture area of the design injection wellbore to a production wellbore of the production well by inputting a flowrate of an injection fluid into a production model.

26. The method of claim 23, further comprises:
determining an economic value of a production fluid from the production well based on a flowrate of an injection fluid, a contact time, a production fluid flowrate, a production fluid temperature, or combinations thereof.

27. The method of claim 23, further comprising:
generating a working injection wellbore path and working fracturing operation in response to the economic value of the production fluid being above a threshold value.

* * * * *